(12) United States Patent
Tal et al.

(10) Patent No.: US 8,751,211 B2
(45) Date of Patent: Jun. 10, 2014

(54) SIMULATION USING PARALLEL PROCESSORS

(75) Inventors: Uri Tal, Netanya (IL); Shay Mizrachi, Hod-Hasharon (IL); Tomer Ben-David, Yavne (IL)

(73) Assignee: Rocketick Technologies Ltd., Ramat Gan (IL)

( * ) Notice: Subject to any disclaimer, the term of this patent is extended or adjusted under 35 U.S.C. 154(b) by 996 days.

(21) Appl. No.: 12/810,310

(22) PCT Filed: Mar. 25, 2009

(86) PCT No.: PCT/IL2009/000330
§ 371 (c)(1),
(2), (4) Date: Jun. 24, 2010

(87) PCT Pub. No.: WO2009/118731
PCT Pub. Date: Oct. 1, 2009

(65) Prior Publication Data
US 2010/0274549 A1 Oct. 28, 2010

Related U.S. Application Data

(60) Provisional application No. 61/039,817, filed on Mar. 27, 2008, provisional application No. 61/079,461, filed on Jul. 10, 2008, provisional application No. 61/086,803, filed on Aug. 7, 2008, provisional application No. 61/110,676, filed on Nov. 3, 2008.

(51) Int. Cl.
*G06G 7/62* (2006.01)
*G06F 17/50* (2006.01)

(52) U.S. Cl.
USPC .............................................. 703/14; 703/13

(58) Field of Classification Search
None
See application file for complete search history.

(56) References Cited

U.S. PATENT DOCUMENTS 6,144,932 A * 11/2000 Hachiya .......................... 703/14
7,353,157 B2 * 4/2008 Wasynczuk et al. ............ 703/14
(Continued)

FOREIGN PATENT DOCUMENTS

JP 08287022 A 11/1996
JP 2004206314 A 7/2004
(Continued)

OTHER PUBLICATIONS

Ottoni et al., "Automatic Thread Extraction with Decoupled Software Pipelining", 38th Annual IEEE/ACM International Symposium on Microarchitecture (MICRO-38), pp. 105-116, Barcelona, Spain, Nov. 12-16, 2005.

(Continued)

*Primary Examiner* — Omar Fernandez Rivas
*Assistant Examiner* — Nithya J Moll
(74) *Attorney, Agent, or Firm* — D. Kligler I.P. Services Ltd.

(57) ABSTRACT

A method for design simulation includes partitioning a verification task of a design into a first plurality of atomic Processing Elements (PEs) having execution dependencies, each execution dependency specifying that a respective first PE is to be executed before a respective second PE. The method further includes computing an order for executing the PEs on a multiprocessor device, which includes a second plurality of processors operating in parallel and schedules the PEs for execution by the processors according to a built-in scheduling policy. The order induces concurrent execution of the PEs by different ones of the processors without violating the execution dependencies irrespective of the scheduling policy. The PEs are executed on the processors in accordance with the computed order and the scheduling policy, to produce a simulation result. A performance of the design is verified responsively to the simulation result.

63 Claims, 7 Drawing Sheets

(56) References Cited

U.S. PATENT DOCUMENTS

| | | | |
|---|---|---|---|
| 7,409,656 | B1* | 8/2008 | Ruehl .................... 716/112 |
| 7,444,276 | B2 | 10/2008 | Watt et al. |
| 7,856,347 | B2 | 12/2010 | Rich et al. |
| 2002/0049956 | A1 | 4/2002 | Bozkus et al. |
| 2005/0091025 | A1 | 4/2005 | Wilson et al. |
| 2006/0242618 | A1 | 10/2006 | Wang et al. |
| 2007/0038987 | A1 | 2/2007 | Ohara et al. |
| 2007/0073528 | A1 | 3/2007 | Watt et al. |
| 2007/0073999 | A1 | 3/2007 | Verheyen et al. |
| 2007/0074000 | A1 | 3/2007 | Colwill et al. |
| 2007/0129924 | A1 | 6/2007 | Verheyen et al. |
| 2007/0129926 | A1 | 6/2007 | Verheyen et al. |
| 2007/0150702 | A1 | 6/2007 | Verheyen et al. |
| 2007/0206611 | A1 | 9/2007 | Shokri et al. |
| 2007/0219771 | A1 | 9/2007 | Verheyen et al. |
| 2007/0250800 | A1 | 10/2007 | Keswick |
| 2008/0114937 | A1 | 5/2008 | Reid et al. |
| 2008/0208553 | A1* | 8/2008 | Borah et al. .................... 703/14 |
| 2009/0150136 | A1 | 6/2009 | Yang |
| 2010/0332202 | A1 | 12/2010 | Nakhia et al. |
| 2011/0184713 | A1 | 7/2011 | Yang |

FOREIGN PATENT DOCUMENTS

| | | | |
|---|---|---|---|
| JP | 2006259821 | A | 9/2006 |
| JP | 2007048052 | A | 2/2007 |
| WO | 0042535 | A1 | 7/2000 |
| WO | 0201346 | A2 | 1/2001 |
| WO | 0135283 | A2 | 5/2001 |
| WO | 2006117683 | A2 | 11/2006 |
| WO | 2010004474 | A2 | 1/2010 |

OTHER PUBLICATIONS

Ottoni et al., "Global Multi-Threaded Instruction Scheduling", 40th Annual IEEE/ACM International Symposium on Microarchitecture (MICRO-2007), pp. 56-67, Chicago, USA, Dec. 1-5, 2007.

Garland et al., "Parallel Computing Experiences with CUDA", IEEE Micro, vol. 28, No. 4, pp. 13-27, Jul. 1, 2008.

Ryoo et al., "Optimization Principles and Application Performance Evaluation of a Multithreaded GPU using CUDA", Proceedings of the 13th ACM SIGPLAN Symposium on Principles and Practice of Parallel Programming (PPoPP'08), pp. 73-82, Salt Lake City, USA, Feb. 20-23, 2008.

European Patent Application # 09794083.7 Extended Search Report dated Nov. 13, 2012.

Chinese Patent Application # 200980126852.2 Office Action dated Aug. 29, 2012.

U.S. Appl. No. 13/084,574 Office Action dated Oct. 11, 2012.

Ezudheen et al., "Parallelizing SystemC Kernel for Fast Hardware Simulation on SMP Machines", 23rd ACM/IEEE/SCS Workshop on Principles of Advanced and Distributed Simulation (PADS 2009), 1087-4097/09, pp. 80-87, Lake Placid, USA, Jun. 22-25, 2009.

Li et al., "Design and Implementation of Parallel Verilog Simulation: PVSim", Proceedings of the 17th International Conference on VLSI Design, pp. 329-334, Mumbai, India, Jan. 5-9, 2004.

Nanjundappa, M., "Accelerating Hardware Simulation on Multi-cores", Master Thesis, Virginia Polytechnic Institute and State University, May 4, 2010.

Flowmaster Group, Flowmaster Announcements 2008.

Todesco et al., "Symphony: A Simulation Backplane for Parallel Mixed-Mode Co-Simulation of VLSI Systems", Proceedings of the 33rd Design Automation Conference, pp. 149-154, Las Vegas, USA, Jun. 3-7, 1996.

U.S. Appl. No. 13/084,574 Office Action dated May 17, 2012.

IEEE Standard 1364-2001, "IEEE Standard Verilog® Hardware Description Language", Sep. 28, 2001.

IEEE Standard 1800-2009, "IEEE Standard for System Verilog—Unified Hardware Design, Specification, and Verification Language", Dec. 11, 2009.

Cadambi et al., "A Fast, Inexpensive and Scalable Hardware Acceleration Technique for Functional Simulation", Proceedings of the 39th IEEE ACM Design Automation Conference (DAC 2002), pp. 570-575, New Orleans, USA, Jun. 10-14, 2002.

Karypis et al., "Multilevel Hypergraph Partitioning: Applications in VLSI Domain", IEEE Transactions on Very Large Scale Integration (VLSI) Systems, vol. 7, No. 1, pp. 69-79, USA, Mar. 1999.

NVIDIA Corporation, "Technical Brief, NVIDIA GeForce® GTX 200 GPU Architectural Overview, Second-Generation Unified GPU Architecture for Visual Computing", May 2008.

Gigabyte Technology Co., Ltd., "NVIDIA® GeForceTM GTX 285 Graphics Accelerator", User's Manual, 2009.

International Application PCT/IL09/00330 Search Report dated Jul. 14, 2009.

International Application PCT/IB09/52820 Search Report dated Jan. 14, 2010.

Rubinstein, M., "Discrete Approaches to Content-Aware Image and Video Retargeting", M.Sc.Dissertation, The Interdisciplinary Center, Efi Arazi School of Computer Science, Herzlia, Israel, May 21, 2009.

Cadambi et al., "SinnPLE: An Inexpensive, Scalable & Fast Hardware Acceleration Technique for Functional Simulation", C&C Research Laboratories, USA, Jun. 18, 2002.

European Patent Application # 09724182 Extended Search Report dated Jun. 19, 2013.

Perinkulam, A.S., "Logic simulation using graphics processors", Master Thesis, University of Massachusetts, pp. 1-52, Sep. 1, 2007.

Narayanan et al.,"Fault simulation on massively parallel SIMD machines algorithms, implementations and results", Journal of Electronic Testing, vol. 3, No. 1, pp. 79-92, Feb. 1, 1992.

Willis et al., "Use of embedded scheduling to compile VHDL for effective parallel simulation", Proceedings of European Design Automation Conference, Brighton, UK, pp. 400-405, Sep. 18-22, 1995.

Mizrachi et., U.S. Appl. No. 13/907,922 dated Jun. 2, 2013.

Japanese patent application No. 2011-517279 Office Action dated Oct. 30, 2013.

* cited by examiner

BACKWARD PHASE PARTITIONING

FORWARD PHASE PARTITIONING

SIMULATION USING PARALLEL PROCESSORS

FIELD OF THE INVENTION

The present invention relates generally to design simulation and verification, and particularly to methods and systems for design simulation using parallel processors.

BACKGROUND OF THE INVENTION

Hardware design is commonly tested and verified by simulation. Logic simulation is often a computationally-intensive task, especially for large and complex designs. In order to enable testing of large hardware designs at a feasible simulation time, various methods and systems perform simulation using parallel processing. For example, Cadambi et al. describe a simulation accelerator based on a Very Long Instruction Word (VLIW) processor in "A Fast, Inexpensive and Scalable Hardware Acceleration Technique for Functional Simulation," Proceedings of the 39$^{th}$ IEEE ACM Design Automation Conference (DAC 2002), New Orleans, La., Jun. 10-14, 2002, pages 570-575, which is incorporated herein by reference. Aspects of logic simulation using VLIW processors are also addressed in U.S. Pat. No. 7,444,276 and in U.S. Patent Application Publications 2007/0219771, 2007/0150702, 2007/0129926, 2007/0129924, 2007/0074000, 2007/0073999 and 2007/0073528, whose disclosures are incorporated herein by reference.

SUMMARY OF THE INVENTION

An embodiment of the present invention provides a method for design simulation, including:

partitioning a verification task of a design into a first plurality of atomic Processing Elements (PEs) having execution dependencies, each execution dependency specifying that a respective first PE is to be executed before a respective second PE;

computing an order for executing the PEs on a multiprocessor device, which includes a second plurality of processors operating in parallel and schedules the PEs for execution by the processors according to a built-in scheduling policy of the microprocessor device, such that the order induces concurrent execution of the PEs by different ones of the processors without violating the execution dependencies irrespective of the scheduling policy of the multiprocessor device;

executing the PEs on the processors in accordance with the computed order and the scheduling policy, to produce a simulation result; and verifying a performance of the design responsively to the simulation result.

In some embodiments, the multiprocessor device includes a Graphics Processing Unit (GPU). Alternatively, the multiprocessor device may include at least one device type selected from a group of types consisting of a Digital Signal Processor and a multi-core Central Processing Unit (CPU). In an embodiment, the verification task includes at least one element selected from a group of elements consisting of the design and a test environment for testing the design.

In a disclosed embodiment, computing the order includes dividing the PEs into a sequence of execution phases that are to be executed in succession so as to preserve the dependencies, and executing the PEs includes executing the PEs in a given execution phase only after the PEs in a preceding execution phases in the sequence are fully executed. Executing the PEs may include invoking the multiprocessor device to execute the preceding execution phase, and invoking the multiprocessor device to execute the given execution phase after execution of the preceding execution phase is completed. In another embodiment, computing the order includes preserving the execution dependencies by inserting dummy PEs into the order.

In some embodiments, computing the order includes ordering the PEs such that a time separation between the PEs specified in each execution dependency is not lower than a predefined minimum separation. In a disclosed embodiment, ordering the PEs includes:

identifying a first subset of the PEs, which depend on PEs whose execution has not yet started;

identifying a second subset of the PEs, which depend on PEs whose execution has started but is not yet completed; and giving priority in the order to the PEs, which are ready for execution and which provide input to a longest path of dependent PEs.

Additionally or alternatively, ordering the PEs includes:

identifying a first subset of the PEs, which depend on PEs whose execution has not yet started;

identifying a second subset of the PEs, which depend on PEs whose execution has started but is not yet completed; and giving priority in the order to the PEs, which are ready for execution and whose execution would transition a highest number of the PEs from the first subset to the second subset.

In some embodiments, partitioning the verification task includes identifying multiple subsets of the PEs, such that each subset includes the PEs that are affected by a respective external event applied to the design, and computing the order includes determining respective orders within each of the subsets. In an embodiment, the external event includes an asynchronous signal. The asynchronous signal may include one of a clock signal and a reset signal.

In some embodiments, the processors in the multiprocessor device are arranged in modules, such that the processors in each module access a device memory of the multiprocessor device jointly, computing the order includes grouping the PEs in PE Groups (PEGs), and executing the PEs includes executing each PEG by a respective module. In an embodiment, executing the PEs includes synchronizing access to the device memory by the PEs within a given PEG. Synchronizing the access may include communicating among the PEs in the given PEG via a shared memory of the module that executes the given PEG. Additionally or alternatively, synchronizing the access may include communicating among the PEs in the given PEG via a hardware synchronization mechanism provided by the module that executes the given PEG. Synchronizing the access may include causing the PEs in the given PEG to access successive addresses in the device memory.

In a disclosed embodiment, grouping the PEs includes identifying PEs that use input produced by a common PE, and grouping the identified PEs in a given PEG. In another embodiment, grouping the PEs includes maximizing respective sizes of the PEGs while minimizing respective numbers of inputs provided to the PEGs. In still another embodiment, grouping the PEs includes iteratively merging pairs of the PEGs so as to maximize the sizes while minimizing the numbers of the inputs and a number of memory access operations performed by each of the PEGs. In yet another embodiment, grouping the PEs includes maximizing respective sizes of the PEGs while minimizing respective numbers of outputs provided to the PEGs. Grouping the PEs may include sub-dividing a given PEG into subsets of the PEs, each subset including the PEs that provide output to a common PEG.

In some embodiments, partitioning the verification task includes selecting each PE from a predefined set of PE types, and executing the PEs includes executing the same instruction by all the processors in the multiprocessor device, and indicating the PE types to the respective processors by providing data to the instruction. In an embodiment, the design includes multiple electronic components that are interconnected according to a circuit topology, the PEs simulate an operation of the electronic components, computing the order includes identifying a first subset of the PEs that respectively simulate a second subset of the electronic components that are not directly connected to one another in the circuit topology, and executing the PEs includes invoking at least some of the processors to execute the PEs in the first subset concurrently. In another embodiment, execution of the PEs is performed responsively to receiving a command from a simulator. In still another embodiment, executing the PEs includes evaluating simulation state values at respective time intervals, and storing the simulation state values in at least one operational mode selected from a group of modes consisting of a continuous mode in which the simulation state values are stored continuously, and a snapshot mode in which only selected snapshots of the simulation state values are stored.

There is additionally provided, in accordance with an embodiment of the present invention, a method for design simulation, including:

partitioning a definition of a design verification task, which defines multiple electronic components that are interconnected according to a circuit topology, into a plurality of software Processing Elements (PEs) that simulate an operation of the electronic components;

identifying a first subset of the PEs that respectively simulate a second subset of the electronic components that are not directly connected to one another in the circuit topology; and invoking multiple processors in a multiprocessor device to execute the PEs in the first subset concurrently.

There is also provided, in accordance with an embodiment of the present invention, a computing method, including:

representing a computing task by a first plurality of atomic Processing Elements (PEs) having execution dependencies, each execution dependency specifying that a respective first PE is to be executed before a respective second PE;

computing an order for executing the PEs on a multiprocessor device, which includes a second plurality of processors operating in parallel and schedules the PEs for execution by the processors according to a built-in scheduling policy of the multiprocessor device, such that the order induces concurrent execution of the PEs by different ones of the processors without violating the execution dependencies irrespective of the scheduling policy of the multiprocessor device; and executing the PEs on the processors in accordance with the computed order and the scheduling policy, to produce a result of the computing task.

There is further provided, in accordance with an embodiment of the present invention, apparatus for design simulation, including:

an interface, which is coupled to accept a definition of a verification task of a design to be simulated; and a Central Processing Unit (CPU), which is arranged to partition the definition into a first plurality of atomic Processing Elements (PEs) having execution dependencies, each execution dependency specifying that a respective first PE is to be executed before a respective second PE, to compute an order for executing the PEs on a multiprocessor device, which includes a second plurality of processors operating in parallel and schedules the PEs for execution by the processors according to a built-in scheduling policy of the microprocessor device, such that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to simulate the design.

There is additionally provided, in accordance with an embodiment of the present invention, apparatus for design simulation, including:

an interface, which is coupled to accept a definition of a verification task of a design, which defines multiple electronic components that are interconnected according to a circuit topology; and a Central Processing Unit (CPU), which is arranged to partition the definition into a plurality of software Processing Elements (PEs) that simulate an operation of the electronic components, to identify a first subset of the PEs that respectively simulate a second subset of the electronic components that are not directly connected to one another in the circuit topology, and to invoke multiple processors in a multiprocessor device to execute the PEs in the first subset concurrently.

There is additionally provided, in accordance with an embodiment of the present invention, apparatus for design simulation, including:

a multiprocessor device, which includes multiple processors configured to operate in parallel and schedules execution by the processors according to a built-in scheduling policy; and a Central Processing Unit (CPU), which is arranged to partition the definition of a verification task of a design into a plurality of atomic Processing Elements (PEs) having execution dependencies, each execution dependency specifying that a first respective PE is to be executed before a second respective PE, to compute an order for executing the PEs on the multiple processors of the multiprocessor device, such that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to simulate the design.

There is also provided, in accordance with an embodiment of the present invention, apparatus for design simulation, including:

a multiprocessor device including multiple processors configured to operate in parallel; and a Central Processing Unit (CPU), which is arranged to partition a definition of a verification task of a design, which defines multiple electronic components that are interconnected according to a circuit topology, into a plurality of software Processing Elements (PEs) that simulate an operation of the electronic components, to identify a first subset of the PEs that respectively simulate a second subset of the electronic components that are not directly connected to one another in the circuit topology, and to invoke the multiple processors of the multiprocessor device to execute the PEs in the first subset concurrently.

There is further provided, in accordance with an embodiment of the present invention, a computing apparatus, including:

an interface, which is coupled to accept a definition of computing task; and a Central Processing Unit (CPU), which is arranged to partition the definition into a first plurality of atomic Processing Elements (PEs) having execution dependencies, each execution dependency specifying that a respective first PE is to be executed before a respective second PE, to compute an order for executing the PEs on a multiprocessor device, which includes a second plurality of processors operating in parallel and schedules the PEs for execution by the processors according to a built-in scheduling policy of the microprocessor device, such that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to produce a result of the computing task.

There is also provided, in accordance with an embodiment of the present invention, a computer software product for design simulation, the product including a computer-readable medium, in which program instructions are stored, which instructions, when read by a computer, cause the computer to partition a definition of a verification task of a design into a first plurality of atomic Processing Elements (PEs) having execution dependencies, each execution dependency specifying that a first respective PE is to be executed before a second respective PE, to compute an order for executing the PEs on a multiprocessor device, which includes a second plurality of processors operating in parallel and schedules the PEs for execution by the processors according to a built-in scheduling policy of the microprocessor device, such that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to simulate the design.

There is additionally provided, in accordance with an embodiment of the present invention, a computer software product for design simulation, the product including a computer-readable medium, in which program instructions are stored, which instructions, when read by a computer, cause the computer to partition a definition of a verification task of a design, which defines multiple electronic components that are interconnected according to a circuit topology, into a plurality of software Processing Elements (PEs) that simulate an operation of the electronic components, to identify a first subset of the PEs that respectively simulate a second subset of the electronic components that are not directly connected to one another in the circuit topology, and to invoke multiple processors in a multiprocessor device to execute the PEs in the first subset concurrently.

The present invention will be more fully understood from the following detailed description of the embodiments thereof, taken together with the drawings in which:

Figure 1:
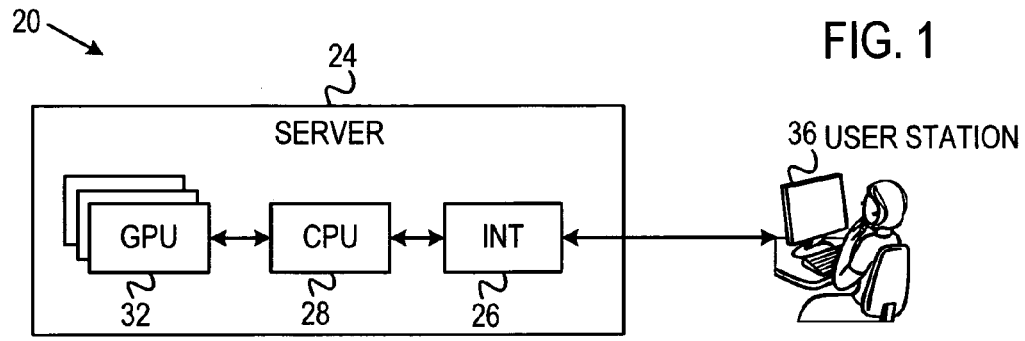
FIG. 1 is a block diagram that schematically illustrates a system for design simulation, in accordance with an embodiment of the present invention.

DETAILED DESCRIPTION OF EMBODIMENTS
OVERVIEW

Design simulation has become an essential step in the development cycle of electronic hardware. As hardware designs grow in size and complexity, simulating such designs requires increasing computational complexity and simulation time. In many cases, simulation time is the limiting factor in the level of testing that can be applied to a given design. Therefore, it is advantageous to perform design simulation using multiple processors that operate in parallel. Electronic hardware designs, however, usually contain large numbers of interdependencies, which make them difficult to partition into parallel computing tasks.

Embodiments of the present invention provide improved methods and systems for design simulation, which achieve a high level of parallelization. The disclosed methods and systems partition a given design verification task into multiple atomic Processing Elements (PEs), which have execution dependencies. A given execution dependency specifies that the output of one PE (referred to as a "driving PE") is used as input by another PE (referred to as a "driven PE"), and therefore the driving PE should be executed before the driven PE. The input verification task may comprise the design to be simulated, some or all of a test environment that tests the design, or both.

The PEs are executed by a multiprocessor device, which comprises multiple processors that operate in parallel. In the embodiments described herein, the PEs are executed by a Graphics Processing Unit (GPU), which comprises multiple processing cores. The GPU applies a built-in scheduling policy for scheduling PEs for execution by the different processing cores. The disclosed methods and systems compute an order in which the PEs are to be executed. The order maximizes the amount of concurrency among the processors while ensuring that the execution dependencies are not violated, irrespective of the scheduling policy of the GPU. Several methods for computing optimal execution orders are described hereinbelow. These methods take into account various GPU architectural constraints and scheduling policies.

In some configurations, the processors are arranged in groups, such that access to external memory can be performed jointly on behalf of the processors in each group. For example, some GPUs comprise multiple multi-processors, each comprising multiple processing cores. Each multi-processor can access a device memory of the GPU in order to read or write data for its respective processing cores. Access to such external memory is usually expensive in terms of latency and throughput. In some embodiments, the PEs are grouped in PE Groups (PEGs), and the PEs in each PEG are executed by the same processor group. The mapping of PEs into PEGs is determined so as to maximize the efficiency of access to the external memory. Several examples of PEG grouping methods are described hereinbelow.

It is possible in principle to devise a system in which the multiprocessor device does not apply any sort of internal scheduling, and is provided with instructions that explicitly define the operation of each processing core in each cycle. This sort of solution, however, limits the solution to specific multiprocessor configurations. By contrast, the methods and systems described herein can be used with a wide variety of multiprocessor device types, such as GPUs, Digital Signal Processors (DSPs) and multi-core Central Processing Units (CPUs), irrespective of their built-in scheduling policies.

As will be shown below, the methods and systems described herein identify PEs that can be executed concurrently because they do not depend on one another. In many cases, the execution orders described herein enable concurrent execution of PEs that simulate areas of the design that are topologically distant from one another. This feature is in sharp contrast to most known partitioning schemes, which typically group together contiguous parts of the design for parallel execution.

In summary, the disclosed methods and systems partition a given hardware design for parallel processing and achieve a high degree of parallelization and memory access efficiency. Although the embodiments described herein refer mainly to the use of GPUs, the disclosed techniques can also be used with other sorts of parallel processors.

System Description

FIG. 1 is a block diagram that schematically illustrates a system 20 for design simulation, in accordance with an embodiment of the present invention. System 20 performs simulation of hardware design, in order to test the design, verify its performance and identify potential design faults.

In the present example, system 20 comprises a server 24, which comprises an interface 26, a Central Processing Unit 28 and one or more Graphics Processing Units (GPUs) 32. Server 24 may comprise any suitable workstation or computing platform. Each GPU, as will be described below, comprises a large number of processing cores that operate in parallel. The methods and systems described herein produce simulation code that maximizes the parallel utilization of the GPU cores, and therefore enables system 20 to simulate highly complex designs with relatively short run times.

Server 24 interacts with a user, e.g., a verification engineer, via a user station 36. Server 24 accepts from the user, via interface 26, a definition of the design to be simulated. The design is typically accepted as one or more files that are written in a Hardware Description Language (HDL) such as VHDL or Verilog. The server also accepts, via interface 26, test-bench definitions, which specify the verification environment of the design. The test-bench specifies external asynchronous events (e.g., clock signals, reset signals and various inputs) that are to be applied to the design. The test-bench also specifies tests that are to be applied to the simulated design. The test bench typically comprises software written in C, Verilog, or in a verification-specific language such as E or System-Verilog.

The server compiles the test-bench and design to produce simulation code, and then runs the simulation code on CPU 28 and GPUs 32. Simulation results are provided to the user via interface 26. The results may comprise, for example, reports as to which tests have passed and which failed, suspected faults, fault locations, and/or any other information that may assist the user in verifying the design.

In the embodiments described herein, the test-bench runs on CPU 28 and the simulated design runs on GPUs 32, although the methods and systems described herein can be used with any other form of partitioning between the CPU and GPUs. The methods and systems described herein can be used to implement a co-simulator (also sometimes referred to as a simulation accelerator), which is run under the control of a simulator. Alternatively, the disclosed techniques can be used to implement a standalone, self-contained simulator. Several partitioning schemes and the trade-offs between them are addressed, for example, in section 6.3, 6.6 and 6.7 of U.S. Provisional Patent Application 61/039,817, cited above, in sections 6.1, 6.3-6.5 and 6.8 of U.S. Provisional Patent Application 61/079,461, cited above, and sections 5.2-5.3 of U.S. Provisional Patent Application 61/086,803, cited above. The embodiments described herein refer to a single GPU. In general, however, any desired number of GPUs can be used.

Typically, CPU 28 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The configuration of system 20 is an example configuration, which is chosen purely for the sake of conceptual clarity. Any other suitable system configuration can also be used. For example, user station 36 may communicate with server 24 locally or over a communication network. In alternative embodiments, the user station functionality can be implemented directly on server 24.

GPU Configuration

Figure 2:
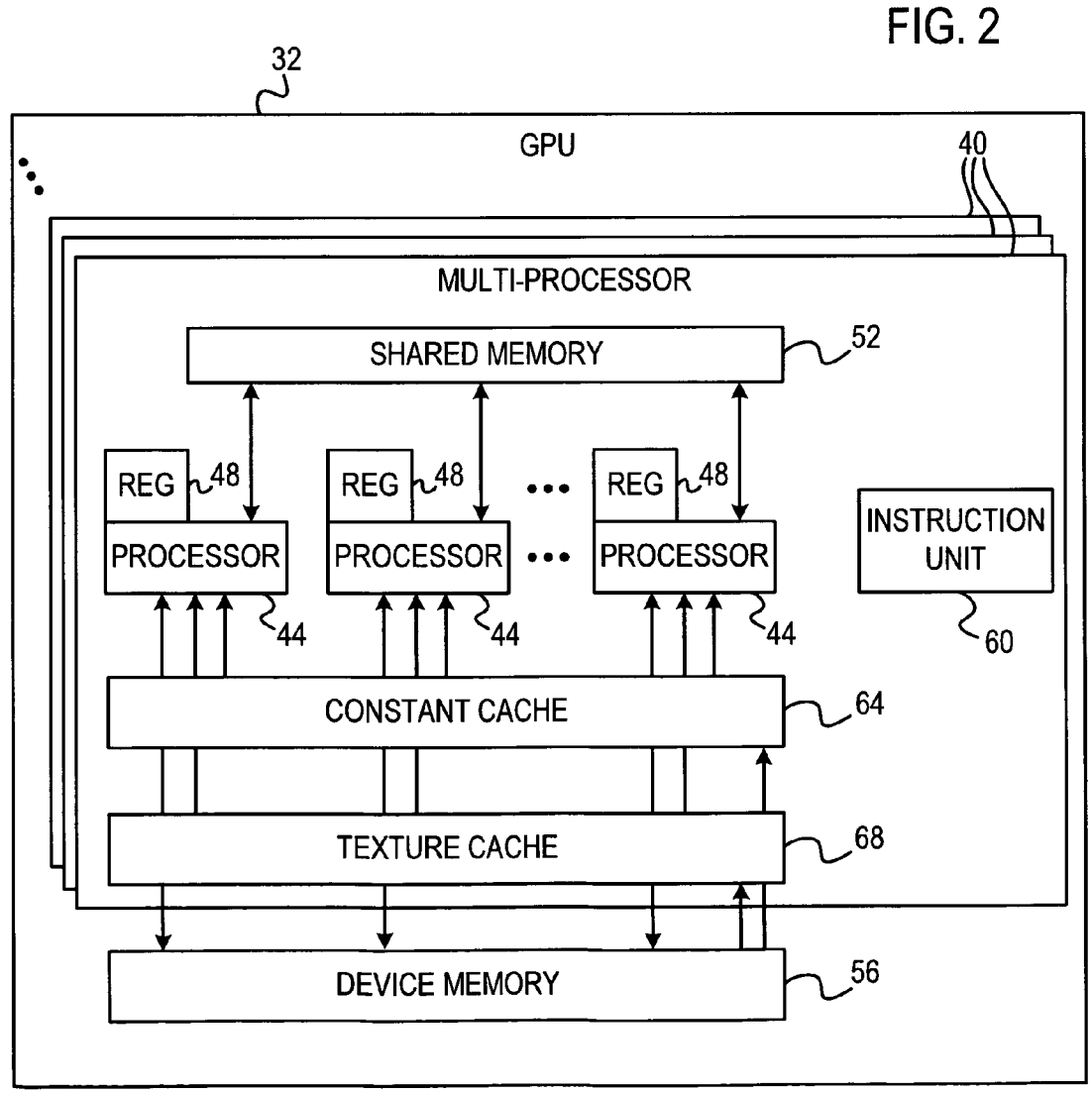
FIG. 2 is a block diagram that schematically illustrates a Graphics Processing Unit (GPU), in accordance with an embodiment of the present invention.

FIG. 2 is a block diagram that schematically illustrates the internal structure of GPU 32, in accordance with an embodiment of the present invention. In the present example, GPU 32 comprises multiple multi-processors 40. Each multi-processor 40 comprises multiple processors 44, which are also referred to herein as processing cores. In some embodiments, each multi-processor 40 comprises a Single Instruction Multiple Data (SIMD) processor. In other words, all processors 44 in a given multi-processor 40 run the same instruction in each clock cycle. Different processors may, however, run the same instruction over different data. In a typical application, all processors 44 in the entire GPU run the same instruction. The differentiation between functions of different processors is introduced by the data, as will be explained further below. In some embodiments, each multiprocessor comprises a Single Instruction Multiple Thread (SIMT) processor. Although the embodiments described herein refer mainly to SIMD processors, the disclosed techniques are similarly applicable to SIMT processors, as well.

Each processor 44 can access a number of local registers 48. The different processors within a given multi-processor 40 can store data in a shared memory 52. This shared memory is accessible to processors 44 of the given multi-processor but not to processors of other multi-processors. In a typical GPU, each multi-processor also comprises an instruction unit 60, as well as a constant cache 64 and a texture cache 68. Instruction unit 60 manages the operation of the multi-processor. In a typical multi-processor, unit 60 creates, manages and executes concurrent threads. In particular, unit 60 may comprise hardware mechanisms that synchronize the operation of different threads running in the multi-processor.

GPU 32 further comprises a device memory 56, which is also referred to herein as an external memory. Memory 56 typically comprises a Dynamic Random Access memory (DRAM). Unlike shared memory 52, device memory 56 is typically accessible to the processors of all multi-processors 40. On the other hand, access to device memory 56 is typically expensive in terms of latency and throughput. In order to access memory 56 efficiently, it is typically desirable to write into or read from consecutive and aligned memory addresses. Some of the methods described herein are concerned with producing simulation code that accesses memory 56 efficiently.

The constant and texture caches typically comprise on-chip cache memories, which can be read and written by host code and read by the GPU code. These caches are typically used for speeding-up reading from respective memory areas in the device memory. Each multi-processor 40 typically accesses the texture cache via a texture unit (not shown in the figure), which implements various addressing modes and data filtering.

The basic software code unit that each processor 44 runs at any given time is referred to as a thread. Typically, CPU 28 invokes GPU 32 by providing the GPU with one or more blocks of threads. A given block of threads is guaranteed to run on the processors of a single multi-processor 40 in SIMD or SIMT mode. Thus, the threads in a given block can communicate with one another via shared memory 52. Each multi-processor 40 can run a single block of threads at any given time.

Typically, the number of threads per block can be greater than the number of processors in the multi-processor. The number of blocks can be greater than the number of multi-processors. The GPU schedules the execution of blocks and threads according to certain internal criteria, which are referred to herein as a built-in scheduling policy. Thus, other than the guarantee that the threads of a given block are executed in the same multi-processors, there is no guarantee as to the order in which the threads of a given block are executed in the multi-processor. There is also no guarantee as to the order in which different blocks are executed in the GPU. In other words, CPU 28 generally has no control over the internal scheduling policy of the GPU.

Some of the methods and systems described herein produce simulation code, which makes use of the architectural features of the GPU, such as the ability to synchronize and share data among threads in a given block. When partitioning the simulated design into threads, the disclosed methods and systems preserve the inherent dependencies between different computational tasks in the design, given the non-guaranteed nature of thread and block execution in the GPU (i.e., irrespective of the scheduling policy of the GPU). These features are explained in detail further below.

The GPU configuration of FIG. 2 is an example configuration, which is chosen purely for the sake of conceptual clarity. In alternative embodiments, any other suitable GPU configuration can also be used. A typical GPU device that can be used for this purpose is the GTX285 device, produced by NVIDIA Corp. (Santa Clara, Calif.). This device comprises thirty multi-processors, each comprising eight processing cores. Further alternatively, although the embodiments described herein refer to the use of a GPU, the disclosed methods and systems can be used with various other types of processors that operate multiple processing cores in parallel.

Efficient Mapping of Design Simulation onto GPU Processing Cores

In some embodiments, CPU 28 of system 20 compiles the design and test-bench into simulation code for execution by GPU 32. (In the embodiments described herein, the same CPU compiles the design and then invokes the GPU to execute the simulation code produced by the compilation. This configuration, however, is in no way mandatory, and is chosen purely for the sake of conceptual clarity. In alternative embodiments, the compilation functions may be separate from the execution functions. For example, the design may be compiled off-line and/or by a different computer from the computer that invokes the GPU).

In general, CPU 28 represents the design and test-bench in terms of atomic execution tasks, which are referred to herein as Processing Elements (PEs). When the design and test-bench are executed by GPU 32, each PE corresponds to a thread that is executed by a certain processor 44. The CPU typically holds a library of PE types, such as, for example, Look-Up Table (LUT) lookups, Flip-Flops, buffering operations, memory access operations, multiplexing operations, arithmetic operations (e.g., addition or multiplication), logical operations or any other suitable tasks. Each PE belongs to one of the types, and operates on certain data.

When processors 44 operate in SIMD mode, each thread typically comprises code that is able to run the different PE types. When the thread is executed, the actual PE type executed by the thread is selected by the data. The data read by the thread can select the actual PE type, for example, by jumping to a program address that carries out the desired PE functionality, or using any other suitable selection means. A typical thread may thus execute the following flow:

Read the desired PE type from memory 56, and jump to the appropriate address that implements this PE type.
Read the PE parameters and input values from memory 56.
Execute the desired PE functionality.
Write the PE output values to memory 56.

(In order to access memory 56 efficiently, CPU 28 may divide the PEs into PE Groups—PEGs. This feature is addressed in detail further below.) This technique can also be used in a similar manner in SIMT processors. In particular, it is generally desirable that threads that are scheduled to run concurrently in a given multi-processor SIMT unit will run the same PE types, so that the unit will run effectively in SIMD mode.

Figure 3:
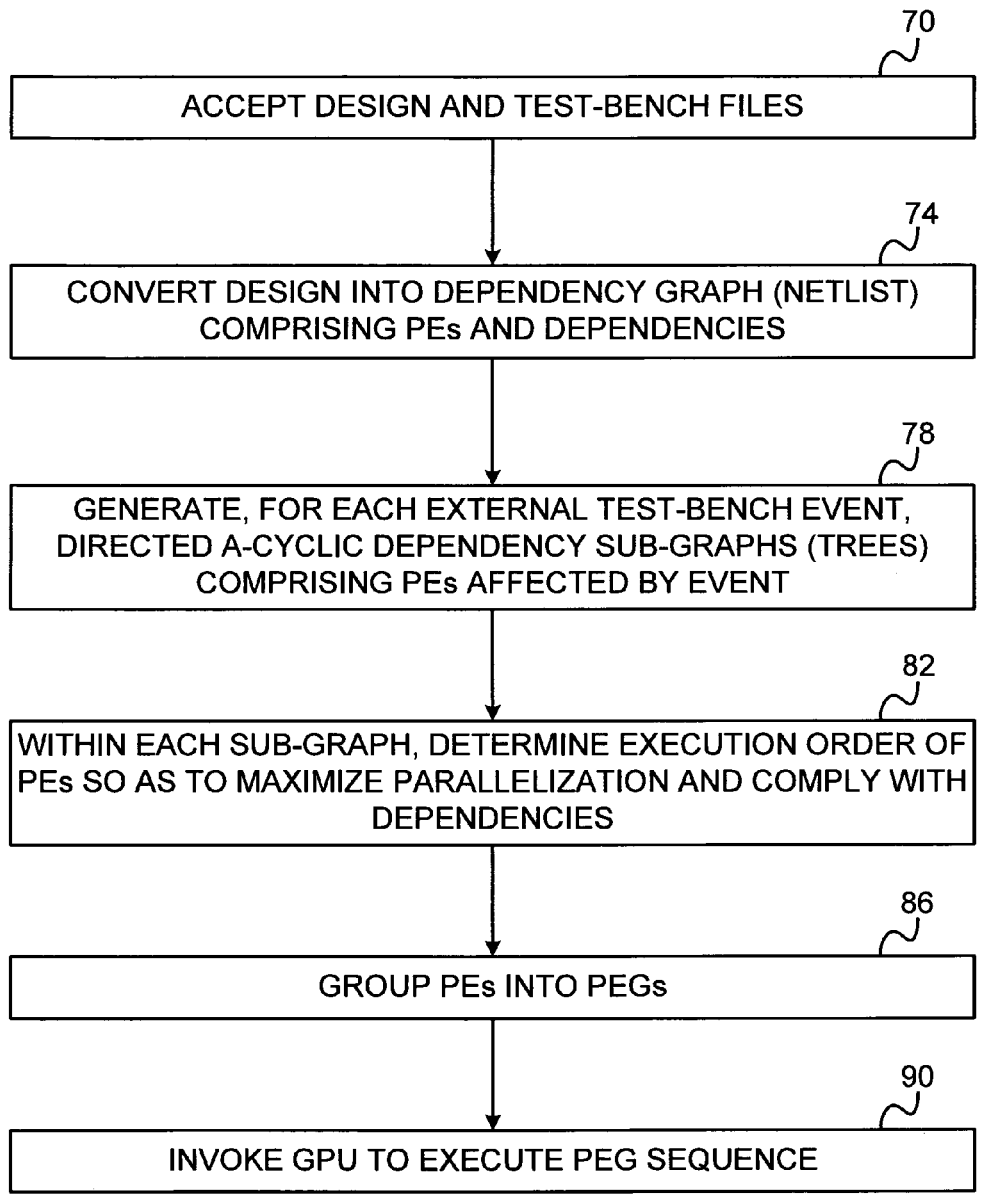
FIG. 3 is a flow chart that schematically illustrates a method for simulating hardware design on a GPU, in accordance with an embodiment of the present invention.
Figure 4:
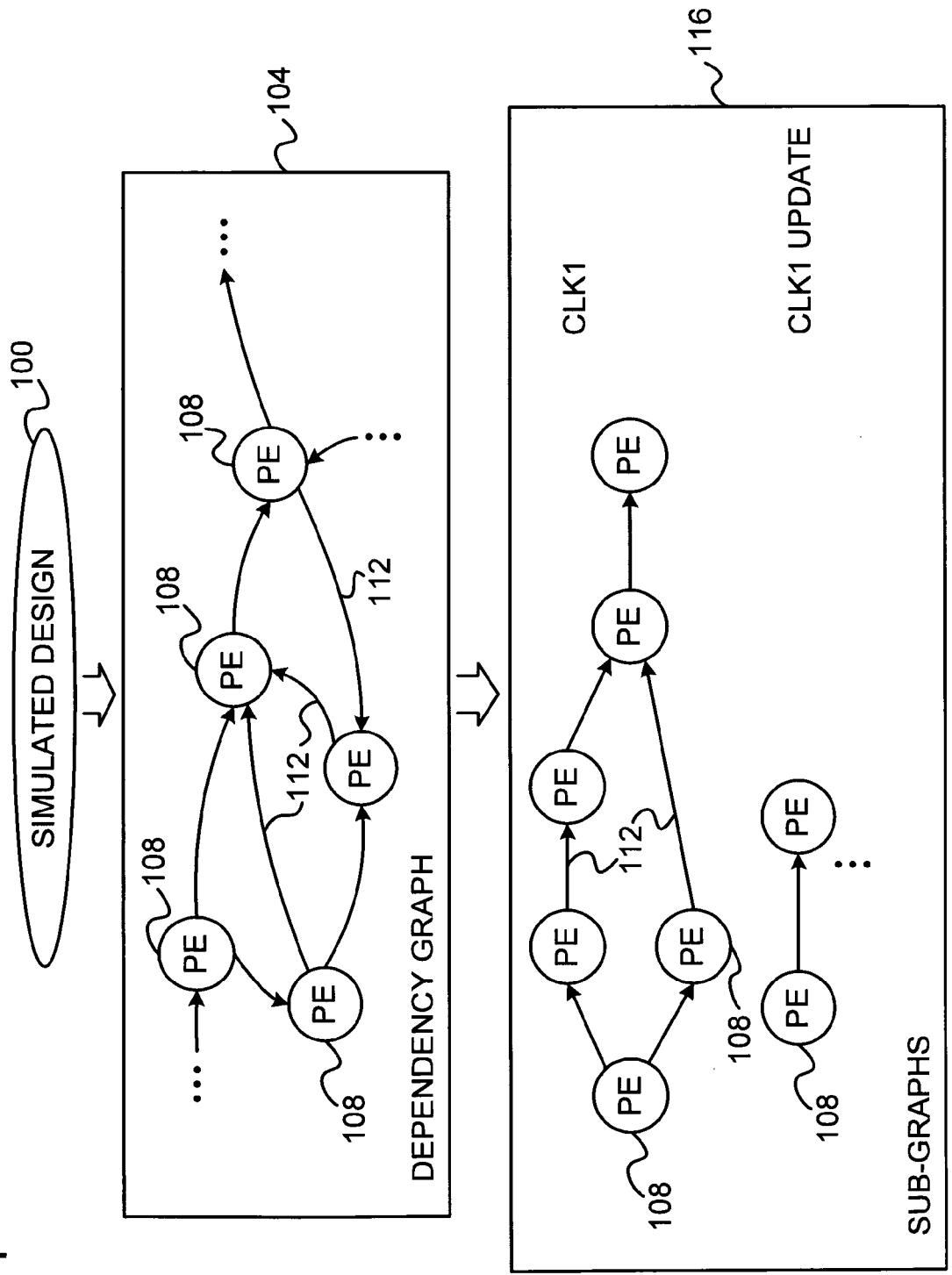
FIG. 4 is a diagram that schematically illustrates a hardware design represented by dependency graphs, in accordance with an embodiment of the present invention.

Reference is now made to FIGS. 3 and 4. FIG. 3 is a flow chart that schematically illustrates a method for simulating hardware design on GPU 32, in accordance with an embodiment of the present invention. FIG. 4 is a diagram that schematically illustrates a hardware design represented by dependency graphs, in accordance with an embodiment of the present invention. The following description follows the method of FIG. 3 and makes simultaneous reference to FIG. 4 for ease of explanation.

The method of FIG. 3 begins with server 24 accepting a design for simulation and a corresponding test-bench, at an input step 70. The design and test-bench are provided by user station 36 via interface 26.

CPU 28 converts the design and test-bench into a dependency graph, at a graph generation step 74. The dependency graph represents the design and test-bench using multiple PEs, which are interconnected by execution dependencies. The dependency graph is also referred to herein as a netlist. A given dependency specifies that the output of a certain PE (referred to as the "driving" PE) is to be used as input to another PE (referred to as the "driven" PE). In other words, the driven PE depends on the driving PE. Such a dependency means that the driving PE is to be executed before the driven PE. Otherwise, the input of the driven PE will not be valid. FIG. 4 shows an example design 100, which is converted into a dependency graph 104. Graph 104 comprises multiple vertices 108 that represent the PEs, and directed edges 112 that represent the execution dependencies. A given edge is directed from the driving PE to the driven PE.

CPU 28 produces multiple sub-graphs from the dependency graph, at a sub-graph generation step 78. Each sub-graph corresponds to a specific external event that is applied to the simulated design by the test-bench. Such an event may comprise, for example, a clock signal or an external input signal. Typically, each such event has an impact on only a subset of the PEs, and therefore each sub-graph typically comprises a subset of the PEs and dependencies of the dependency graph. Unlike the dependency graph produced at step 74, which may generally be cyclic, each sub-graph is a-cyclic. FIG. 4 shows an example of multiple sub-graphs 116, which are produced from graph 104. Although each sub-graph is associated with a given test-bench event, some test-bench events may correspond to more than a single sub-graph.

For example, each clock signal (or any other simulation signal value change) typically corresponds to two sub-graphs, which are referred to herein as CLOCK and CLOCK UPDATE sub-graphs. The CLOCK sub-graph of a given clock signal typically comprises the set of PEs, which provide input (directly or indirectly) to PEs that are clocked by this clock signal. The CLOCK sub-graph typically does not contain the clocked PEs themselves. The CLOCK-UPDATE sub-graph comprises the clocked PEs that update their output according to their inputs. The CLOCK and CLOCK-UPDATE sub-graphs are separate, so that PEs in the CLOCK graph are driven only by previous-cycle values of the clocked PEs, and not by a mixture of pre-cycle and post-cycle values.

The simulated design may be clocked by any desired number of clock signals. In some embodiments, the CPU scans the different PEs in the dependency graph and identifies the PEs that are clocked by each clock signal, as well as the PEs that depend on the clocked PEs. In some embodiments, the CPU produces an additional sub-graph, which represents the logic that returns output signals from the design to the test-bench.

At this stage, the CPU has compiled the design and test-bench into a collection of directed, a-cyclic graphs. Each sub-graph comprises a set of PEs and dependencies, which represent a part of the overall dependency graph that is affected by a certain test-bench event (e.g., clock).

Within each sub-graph, the CPU computes an order of executing the PEs, at an order computation step 82. The execution order attempts to optimize the concurrency of executing the PEs by processors 44 of GPU 32, but without violating the execution dependencies. In other words, the CPU determines an execution order that distributes PE execution among as many parallel processors as possible, given the constraints (defined by the dependencies) that certain PE outputs are to be used as inputs for other PEs. Moreover, the CPU computes an execution order, which achieves these goals irrespective of the built-in scheduling performed in the GPU, which is not under control of the CPU or the simulation code. Several example methods for computing the optimal execution order are described in FIGS. 5-8 below. This process is repeated for each sub-graph.

By executing the PEs according to the optimal execution order, system 20 maximizes concurrency without violating the execution dependencies. In addition, the CPU may further increase the simulation performance by synchronizing the access of the different PEs to device memory 56. As noted above, it is highly advantageous to access memory 56 in a series of memory access (read or write) operations to successive and aligned memory addresses.

In some embodiments, the CPU synchronizes the memory access operations by grouping PEs in PE Groups (PEGs), at a grouping step 86. When the GPU is invoked, the PEs in each PEG are provided to the GPU in the same block of threads, and are therefore guaranteed to run in the same multi-processor 40. Since the PEs in a given PEG are provided to the CPU as a block of threads and therefore run on the same multi-processor, they are able to communicate with one another via shared memory 52 of this multiprocessor. In these embodiments, the PE code has provisions that synchronize the access to device memory 56 by the different PEs within each PEG.

For example, the PE code may comprise "synchronization barriers" at a certain code location. The synchronization barrier halts the thread execution until all the PEs in the group have reached the barrier. The PEs in a given PEG can signal to one another whether they have reached the barrier using a hardware-implemented synchronization mechanism. This mechanism is typically performed by unit 60 in the multi-processor 40 that runs the PEG. A typical PEG code may have the following flow:

Read PE types and parameters for all PEs in the PEG.
Read input values from device memory 56 to shared memory 52.
[Synchronization barrier]
Execute PE functions.
[Synchronization barrier]
Write output values to device memory 56.

Alternatively, the output values can be initially written to shared memory 52 (after execution and before the second synchronization barrier). Following the second synchronization barrier, the output values can be written to device memory 56 in bulk, e.g., to consecutive memory addresses.

In some embodiments, the GPU provides provisions for each thread to determine which PE type it is requested to execute and which data it is requested to process. For example, the thread may read an identification number (ID) that indicates this information, e.g., from a certain register.

By synchronizing all the PEs in the PEG at the synchronization barriers, the read and write operations of the different threads (to and from device memory 56) can be synchronized. In order to access device memory 56 efficiently, it is desirable that the memory addresses from which the PEs in the PEG read their inputs, and the addresses to which they write their outputs, are set to consecutive memory addresses to the extent possible. When implementing step 86, the CPU may group PEs in PEGs using any suitable method or criterion. Several example methods for grouping PEs in PEGs are described shown in FIGS. 9-12 below.

After grouping the PEs of each sub-graph in PEGs, the CPU invokes the GPU to execute the PEGs, at a GPU invocation step 90. Typically, the CPU performs one or more GPU invocations. In each invocation, the CPU provides the GPU with a set of thread blocks, which were compiled at steps 74-86 above. The GPU executes the thread blocks in accordance with its internal scheduling scheme. As explained above, the invocation sequence and the partitioning of threads into blocks maximize the concurrency among parallel processors 44 of the GPU, while preserving the dependencies defined in the dependency graph that represents the simulated design.

As already noted above, the compilation stage of FIG. 3 (steps 70-86) may be performed off-line and/or by a different computer from the computer that carries out GPU invocation step 90.

Example Methods for Determining the Optimal Execution Order

CPU 28 may apply any suitable method for determining the execution order of the PEs in a given sub-graph, i.e., for implementing step 82 of the method of FIG. 3 above. In some embodiments, the CPU divides a given sub-graph into execution phases. Each phase comprises PEs that can be executed concurrently, and the PEs in each phase drive the PEs in the next phases.

Figure 5:
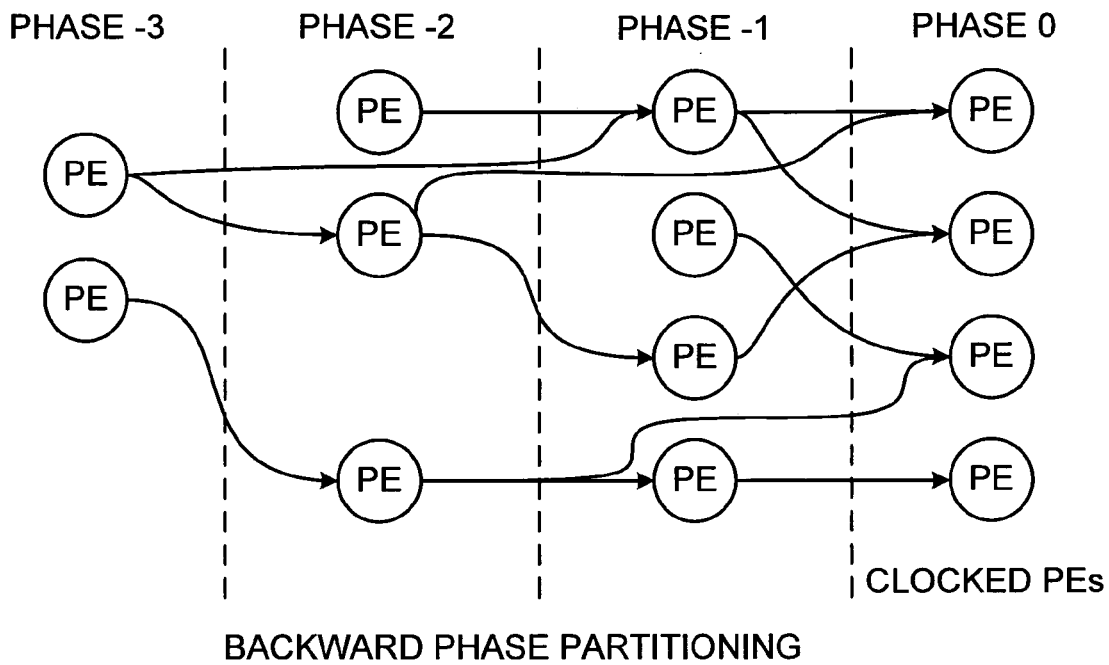
FIGS. 5 and 6 are diagrams that schematically illustrate methods for dividing a dependency graph into execution phases, in accordance with embodiments of the present invention.
Figure 6:
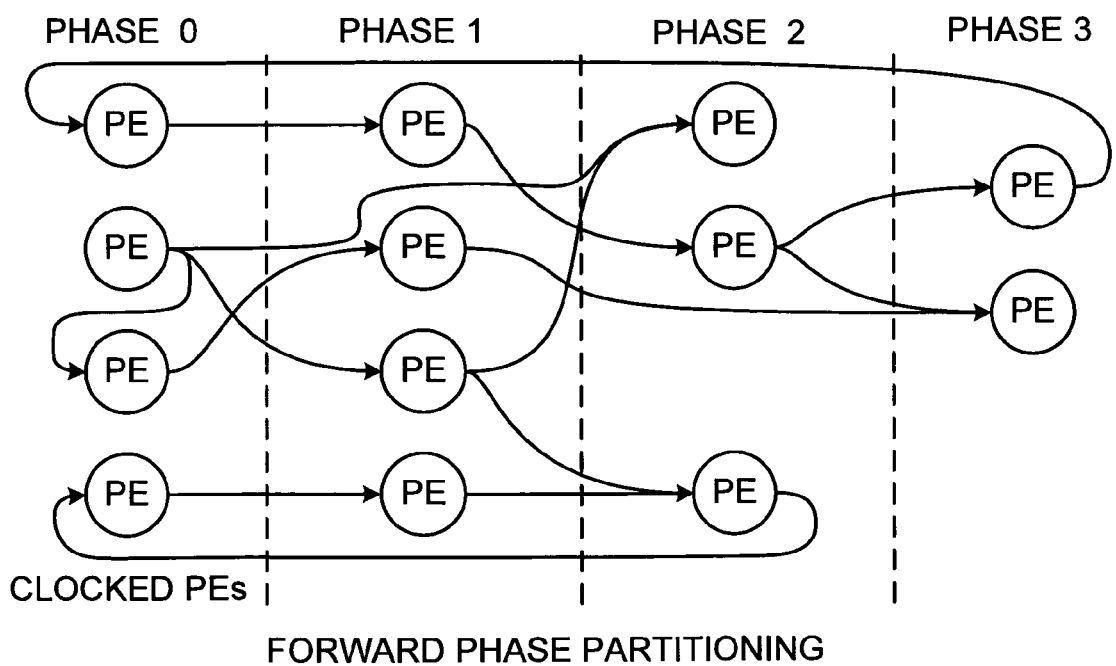

FIGS. 5 and 6 are diagrams that schematically illustrate methods for dividing a dependency graph into execution phases, in accordance with embodiments of the present invention. (The description that follows refers to division of the dependency graph, and not an individual sub-graph, into phases. This description may be applicable, for example, in a design having only a single clock. Generally, the processes of FIGS. 5 and 6 can be applied to the entire dependency graph or to individual sub-graphs. Note that in the specific example of FIG. 6 the graph is cyclic, a situation that does not occur in sub-graphs.)

FIG. 5 shows a process that is referred to as backward phase partitioning. In this process, the CPU begins by identifying the PEs that are clocked by the clock signal in question, and associating them with phase "0". From the remaining PEs, the CPU identifies the PEs whose outputs are used as input only to PEs in phase "0". These PEs are associated with phase "−1". The CPU then identifies the remaining PEs whose outputs are used as input to PEs in phase "0" or "−1". These PEs are associated with phase "−2". The process continues until all PEs have been associated with phases between "0" and "−n". In each clock cycle, the execution order begins with phase "0" and continues backwards to phase "−n", "−(n−1)", ..., "−2" and "−1". The backward partitioning scheme attempts to delay execution of each PE to the latest possible phase.

FIG. 6 shows a process that is referred to as forward phase partitioning. In this process, the CPU attempts to execute each PE as early as possible, often immediately after its input values are evaluated. In the forward partitioning process, the CPU again begins by identifying the PEs that are clocked by the clock signal in question and associating them with phase "0". From the remaining PEs, the CPU identifies the PEs whose inputs are provided by the PEs in phase "0". These PEs are associated with phase "1". The CPU then identifies the remaining PEs whose inputs are provided by PEs in phases "0" and "1", and associates these PEs with phase "2". The process continues in the same manner, until all the PEs have been assigned to phases between "0" and "n". The execution order in each clock cycle begins with phase "0" and advances to phases "1", "2" until "n". Note that the PEs in phase "0" may depend on PEs in any phase.

As noted above, the GPU usually does not guarantee an execution order among threads. On the other hand, the schemes of FIGS. 5 and 6 assume that all the PEs in a given phase finish executing before execution of the next phase begins. Otherwise, the PE inputs may not be valid. The CPU may apply various measures in order to ensure that this assumption is met. For example, the CPU may execute each phase in a separate GPU invocation. When using this technique, the GPU is invoked by the CPU to execute a given phase only after the preceding phase is executed completely.

In many practical cases, such a sequence of GPU invocations adds considerable latency to the execution process.

In an alternative embodiment, the CPU inserts "dummy PEs" between successive phases, and executes the entire sub-graph in a single GPU invocation. A dummy PE is not part of the simulated design, and its purpose it to introduce sufficient delay between the executions of successive phases, so that the outputs of a given phase are fully evaluated when the next phase begins execution. Typically, the delay of the dummy PEs may be smaller than the latency introduced by separate GPU invocations.

Yet another possible method for determining the PE execution order is referred to as a "single-phase" scheme. In this scheme, the CPU does not divide the PEs into phases. Instead, the CPU orders the PEs in a sequence, which ensures that each PE will be executed only after its inputs are fully evaluated. The single-phase scheme assumes that the GPU is able to execute W threads concurrently, and that thread scheduling is deterministic and known a-priori. For ease of explanation, the description assumes that all threads have the same execution duration, although this assumption is not mandatory. The execution duration of a thread is referred to as a slot.

When determining the execution order using the single-phase scheme, each dependency of the form "PE_y depends on PE_x" is translated to the constraint "PE_x is to be placed at least W slots before PE_y in the execution sequence." If this condition is met, when PE_y is scheduled for execution, PE_x is already fully executed and flushed out of the GPU. In most practical cases, the thread execution duration in the GPU has a certain variance, and the value of W is typically increased to account for this variance.

Figure 7:
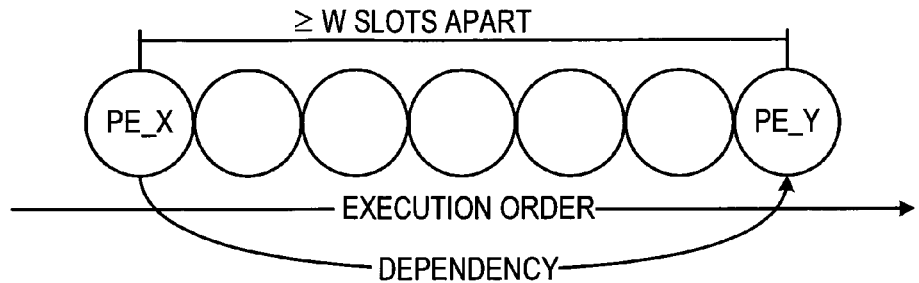
FIG. 7 is a diagram that schematically illustrates an optimal execution order of a dependency graph, in accordance with an embodiment of the present invention.

FIG. 7 is a diagram that schematically illustrates an execution order computed by the single-phase scheme, in accordance with an embodiment of the present invention. The figure shows a PE denoted PE_y, which depends on a PE denoted PE_x. In order to ensure that the output of PE_x is valid when PE_y begins execution, PE_x is places at least W slots before PE_y in the execution order.

Figure 8:
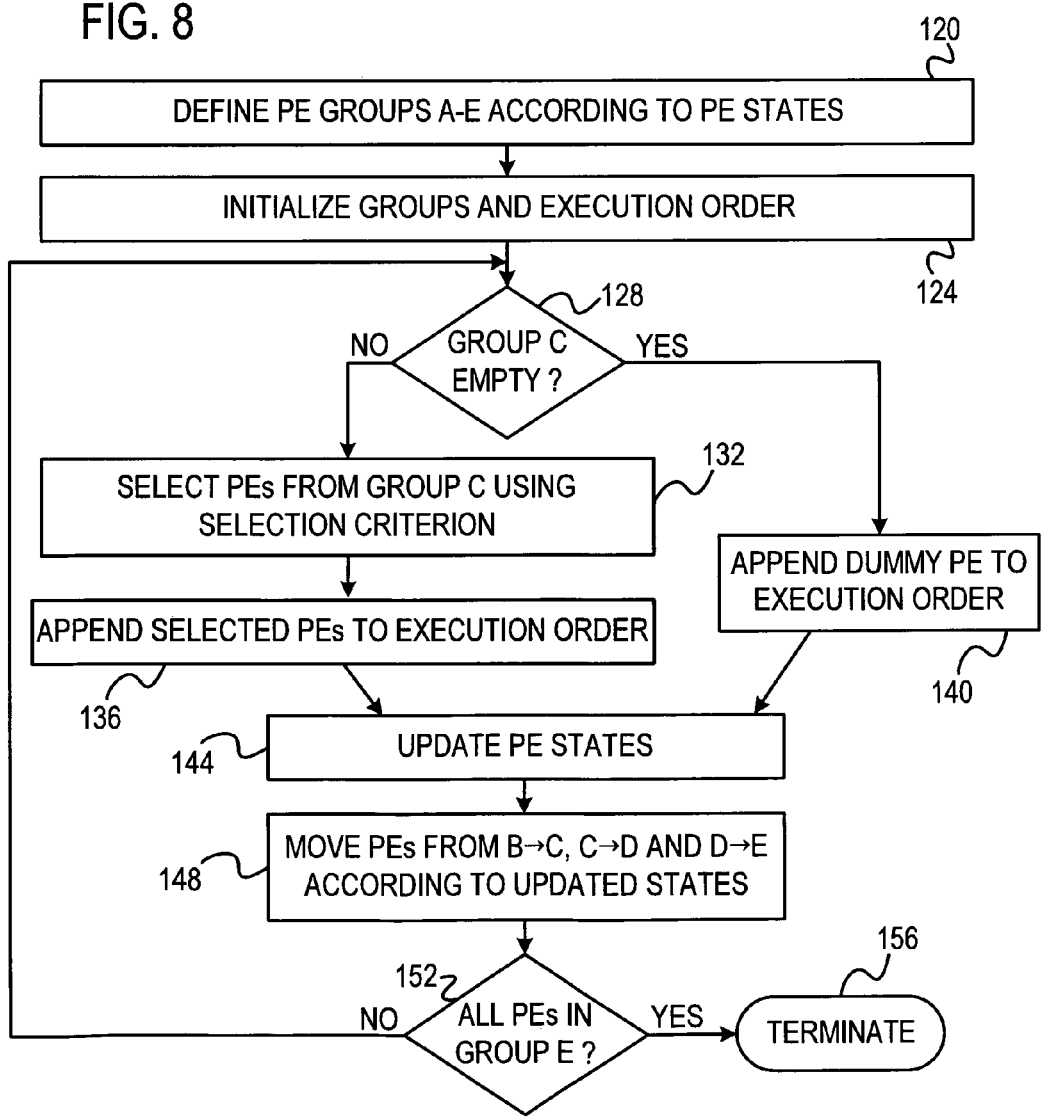
FIG. 8 is a flow chart that schematically illustrates a method for determining an optimal execution order for a dependency graph, in accordance with an embodiment of the present invention.

FIG. 8 is a flow chart that schematically illustrates an example method for determining the optimal execution order of the single-phase scheme, in accordance with an embodiment of the present invention. In this method, each PE may be classified into one of five possible states denoted A ... E. The state of a given PE depends on its execution status and on the execution status of its dependencies, i.e., the PEs that provide its inputs:

State A: The PE dependencies have not yet started execution.
State B: At least some of the PE dependencies have started execution, but not all dependencies have finished execution.
State C: The PE dependencies finished execution. The PE is ready to run.
State D: The PE started execution.
State E: The PE finished execution.

The method of FIG. 8 begins with CPU 28 defining five groups of PEs, at a group definition step 120. The groups correspond to the five states defined above and are also denoted A ... E. A PE that is in a given state is regarded as belonging to the corresponding group. The CPU initializes the groups and the execution order, at an initialization step 124. Initially, the execution order is empty, group C contains all the PEs that depend only on PEs from the previous clock cycle, and all other PEs are in group A.

The CPU checks whether group C is empty, at a checking step 128. If group C is not empty, the CPU selects one or more PEs from group C based on a predefined selection criterion, at a selection step 132. In some embodiments, the CPU selects the PE or PEs whose execution would move the most PEs from group A to group B. Typically, the CPU begins by examining individual PEs in group C and tries to identify the PE whose execution would move the largest number of PEs from A to B. If no such PE exists, the CPU may examine PE pairs in group C. If no such PE pair exists, the CPU may examine PE triplets, and so on. In an alternative embodiment, the CPU selects one or more PEs from group C whose execution would provide input to the longest execution path (i.e., the longest chain of dependent PEs) in the current GPU invocation. Further alternatively, the CPU may apply a selection criterion that combines the two criteria described above. Having selected the appropriate PE or PEs, the CPU appends the selected PE or PEs to the execution order, at an appending step 136.

If, on the other hand, the CPU concludes at step 128 that group C is empty, the CPU appends a dummy PE to the execution order, at a dummy appending step 140. After appending either the selected PE (or PEs) or the dummy PE, the CPU updates the states of the different PEs, at a state updating step 144. Based on the updated PE states, the CPU moves PEs from group B to C, from Group C to D and from group D to E, at a group updating step 148.

The CPU then checks whether all PEs have reached group E, at a termination checking step 152. If all PEs have finished execution, the method terminates at a termination step 156. Otherwise, the method loops back to step 128 above, and the CPU continues to append PEs to the execution order.

It should be noted that the execution orders determined using the above-described methods often execute concurrently PEs, which simulate parts of the design that are topologically distant from one another (because distant parts of the design usually do not depend on one another). The design definition provided to server 24 typically models multiple electronic components, which are interconnected according to a certain circuit topology. By determining the execution orders using the above-described methods, PEs that are executed concurrently often represent electronic components that are topologically distant (i.e., not directly connected to one another in the circuit topology).

PE Grouping in PEGs

As noted above, data storage and retrieval in device memory 56 of GPU 32 is expensive in terms of latency and throughput. Typically, a single memory access to the device memory reads or writes several hundreds of bytes, even if the actual number of bytes that needs to be stored or retrieved is smaller. Therefore, it is highly advantageous to aggregate as much information as possible for storage or retrieval into each such operation.

In some embodiments, CPU 28 groups PEs in PEGs that run in the same multi-processor 40 of GPU 32, in order to access device memory 56 efficiently. The CPU aggregates multiple memory access operations of individual PEs in a given PEG to form a single memory access operation to the device memory. Using this mechanism, the number of memory access operations applied to device memory 56 is reduced considerably. This technique is especially efficient if the PEs in the PEG access successive and aligned addresses in the device memory. A method that uses the multi-processor shared memory for synchronizing the access to memory 56 by the different PEs in a PEG has been described above.

The CPU may apply any suitable criteria for grouping PEs in PEGs, so that the aggregation of PE memory access operations will be efficient. Typically, the CPU will attempt to group PEs having overlapping (common) inputs in the same PEG. A typical grouping criterion will aim to maximize the number of PEs in each PEG, and minimize the number of inputs provided collectively to each PEG. Grouping PEs in this manner reduces the number of read and write operations to memory 56.

Figure 9:
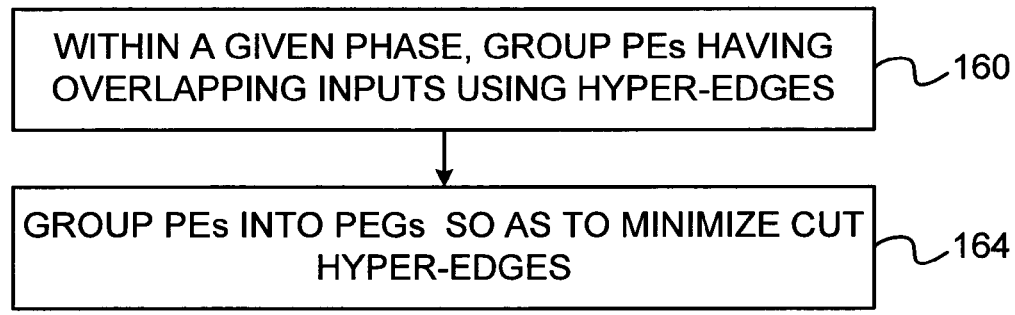
FIG. 9 is a flow chart that schematically illustrates a method for grouping Processing Elements (PEs) in PE Groups (PEGs), in accordance with an embodiment of the present invention.

FIG. 9 is a flow chart that schematically illustrates an example method for grouping PEs in PEGs, in accordance with an embodiment of the present invention. The method of FIG. 9 is particularly suitable for use in conjunction with methods that determine the optimal PE execution order by dividing the PEs into phases, such as the methods of FIGS. 5 and 6 above. In such implementations, the method of FIG. 9 can be used for grouping the PEs in each execution phase into PEGs.

Figure 10:
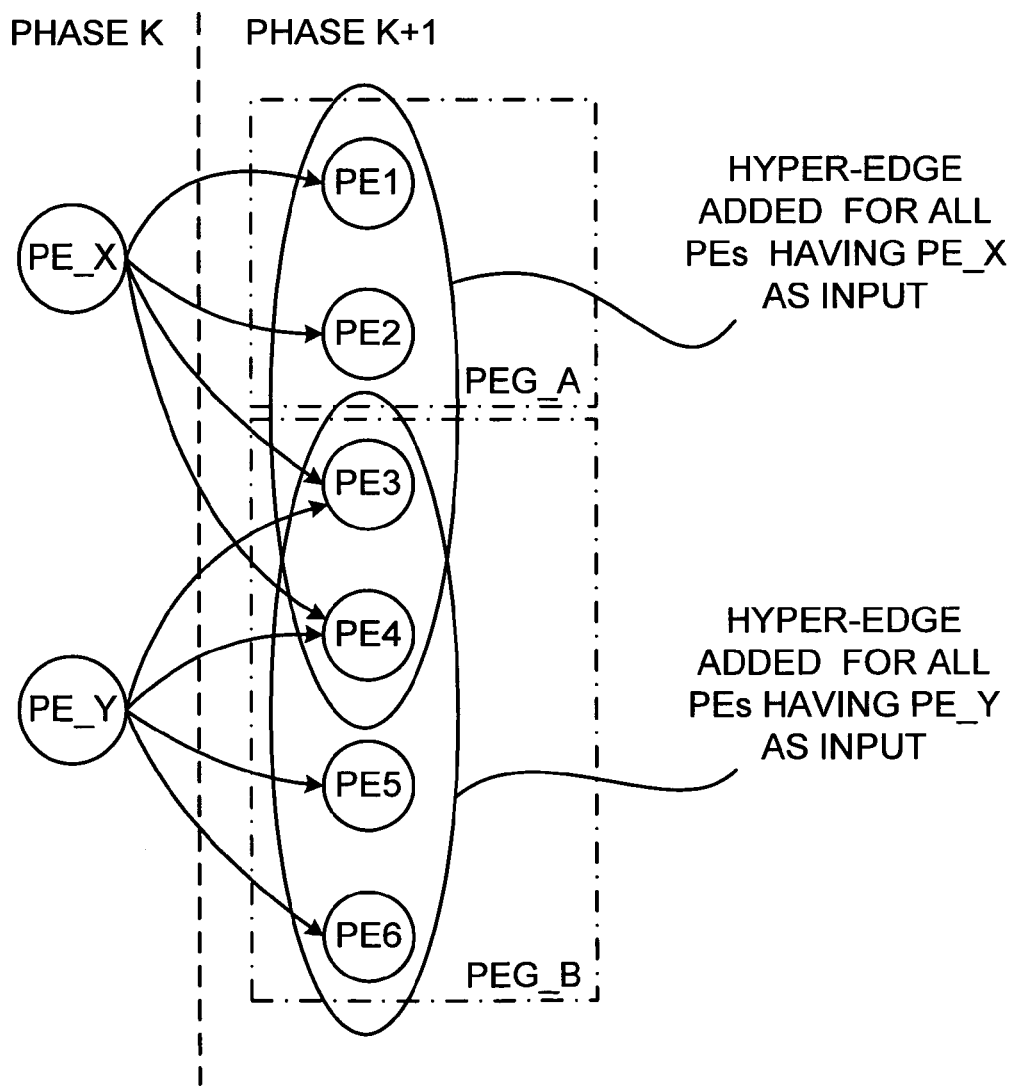
FIG. 10 is a diagram that schematically illustrates an example of PEs grouped in PEGs, in accordance with an embodiment of the present invention.

FIG. 10 is a diagram that schematically illustrates an example of such a scenario, in accordance with an embodiment of the present invention. The description that follows refers to FIGS. 9 and 10 simultaneously for ease of explanation.

The method of FIG. 9 begins with CPU 28 identifying, within a given execution phase, PEs having overlapping inputs (i.e., PEs whose inputs are provided by the same PE in a previous phase) and marking these PEs by hyper-edges, at a hyper-edge definition step 160. The example of FIG. 10 shows six PEs denoted PE1 . . . PE6, which belong to a certain execution phase. PE1 . . . PE4 depend on input provided by PE_x in the previous phase, and are therefore marked by a common hyper-edge. PE3 . . . PE6 depend on input provided by PE_y in the previous phase, and are marked by another common hyper-edge.

The CPU groups the PEs in the given phase in PEGs in a manner that minimizes the number of cut hyper-edges, at a PEG grouping step 164. A cut hyper-edge means a hyper-edge whose PEs belong to more than one PEG. In the example of FIG. 10, PE1 and PE2 are grouped in a PEG denoted PEG_A, and PE3 . . . PE6 are grouped in a PEG denoted PEG_B. The hyper-edge that marks the PEs whose inputs are provided by PE_x is cut between the two PEGs. The hyper-edge that marks the PEs whose inputs are provided by PE_y, on the other hand, is not cut since all of its members are grouped in PEG_B.

The effect of cut hyper-edges on the number of memory access operations can be seen from the example of FIG. 10. Since the hyper-edge of PE_y is not cut, the output of PE_y can be read only once by PEG_B. The output of PE_x, on the other hand, will be read twice (once by PEG_A and once by PEG_B) since its hyper-edge is cut between the two PEGs. This example demonstrated the advantage of grouping PEs in PEGs in a manner that minimizes the number of cut hyper-edges. Note that this grouping criterion often creates PEGs that are not balanced in the number of PEs. In the example of FIG. 10, balanced PEGs having three PEs each would have cut both hyper-edges, and would have resulted in a higher number of read operations. Additionally or alternatively, the grouping criterion may use any other suitable logic or heuristic. For example, the CPU may also attempt to balance the number of inputs to each PEG.

When applying the method of FIG. 9, CPU 28 may use various known processes for graph partitioning using hyper-edges. Example methods are described by Karypis et al., in "Multilevel Hypergraph Partitioning: Applications in VLSI Domain," IEEE Transactions on Very Large Scale Integration (VLSI) Systems, volume 7, no. 1, March 1999, pages 69-79, which is incorporated herein by reference. Alternatively, any other suitable method can also be used.

Figure 11:
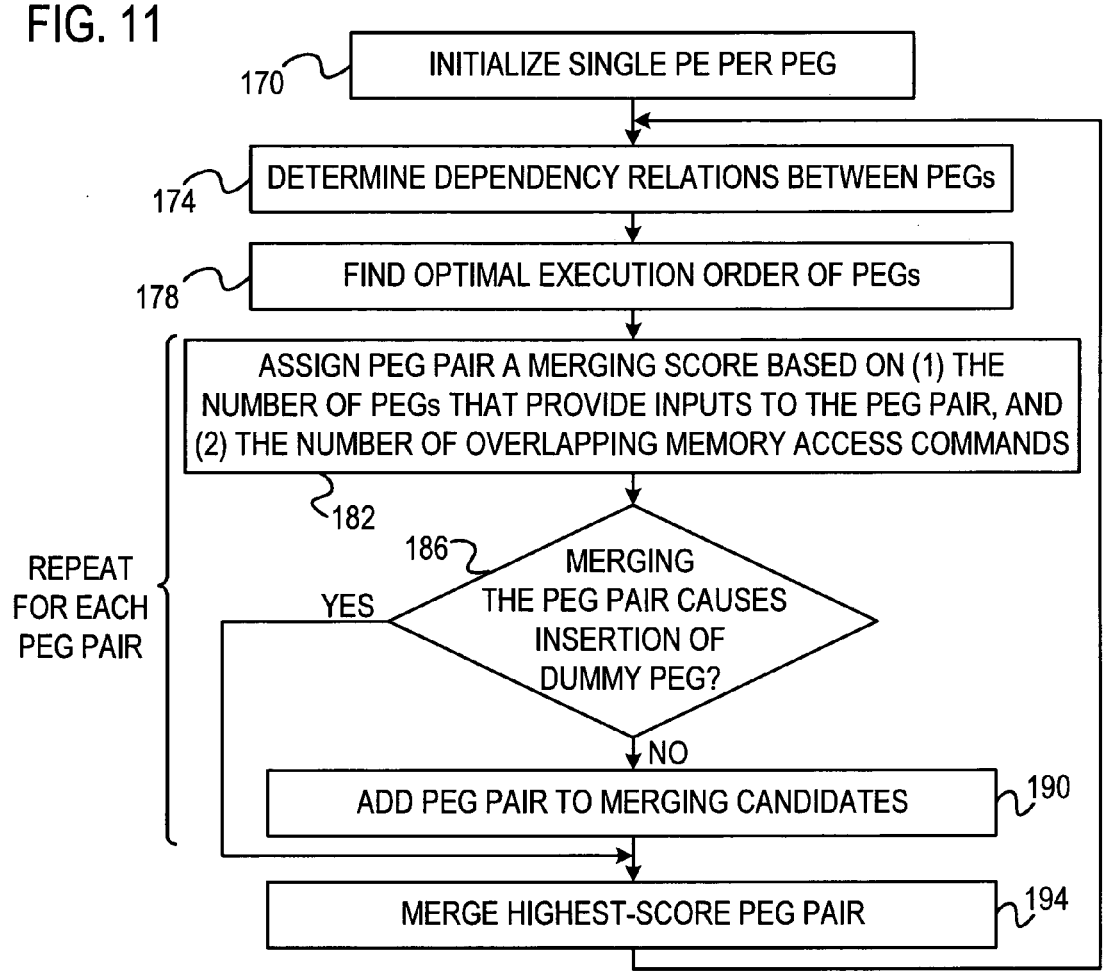
FIG. 11 is a flow chart that schematically illustrates an iterative process for grouping PEs in PEGs, in accordance with an embodiment of the present invention.

FIG. 11 is a flow chart that schematically illustrates another possible process for grouping PEs in PEGs, in accordance with an alternative embodiment of the present invention. The method of FIG. 11 is particularly suitable for use in conjunction with the single-phase scheme of FIGS. 7 and 8 above. The method of FIG. 11 groups PEs into PEGs in an iterative process, which begins with one PE per PEG and attempts to gradually increase the PEG size by merging PEGs to form larger PEGs. The iterative process groups the PEGs in a manner that minimizes the number of inputs of each PEG, while applying minimal changes to the optimal execution order determined using the single-phase scheme.

Figure 12:
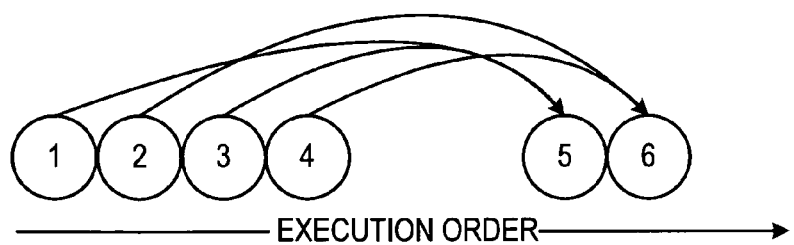
FIG. 12 is a diagram that schematically illustrates an example of PEs grouped iteratively in PEGs, in accordance with an embodiment of the present invention.
Figure 12:
Figure 12:

FIG. 12 is a diagram that schematically illustrates an example of such a process, in accordance with an embodiment of the present invention. The description that follows refers to FIGS. 11 and 12 simultaneously for ease of explanation.

The method of FIG. 11 begins with CPU 28 associating each PE in the execution order with a separate PEG, at an initialization step 170. This initial situation is shown at the top of FIG. 12 and is denoted "Iteration #1." The CPU then determines the dependency relations between PEGs, at a relation identification step 174. PEG_Y is regarded as depending on PEG_X if one or more PEs in PEG_Y depend on one or more PEs in PEG_X. The CPU now determines the optimal execution order of the PEGs, at an order identification step 178. In this step, each PEG (rather than each individual PE) is regarded as a basic execution unit.

The CPU scans over the different pairs of PEGs in the execution order and assigns each PEG pair a merging score, at a score calculation step 182. The merging score depends on (1) the number of PEGs that provide inputs to the PEG pair in question, and (2) the number of memory access operations to the device memory, which the two PEGs in the pair have in common. Using such a criterion, high merging scores are assigned to PEG pairs whose merging would (1) reduce the number of inputs to the merged PEG and (2) reduce the number of memory access operations.

In some cases, merging of a certain PEG pair necessitates the addition of a dummy PEG to the execution order, so as not to violate the execution dependencies. In some embodiments, the CPU regards this sort of merging as undesired. Thus, for each PEG pair, the CPU checks whether merging this pair would cause insertion of a dummy PEG, at a dummy checking step 186. If a dummy PEG is not needed, the CPU adds the PEG pair to a list of candidates for merging, at a list adding step 190. Otherwise, i.e., is a dummy PEG is needed, the PEG pair is not considered a candidate for merging. After the candidate list is completed, the CPU merges the PEG pair having the highest merging score, at a merging step 194. The method then loops back to step 174 above, in which the CPU determines the optimal PEG execution order after merging.

FIG. 12 illustrates this iterative merging process. In "Iteration #1" each PE is regarded initially as a separate PEG. In "Iteration #2" the PEs have been merged into three PEGs, in a manner that minimizes inter-PEG dependencies. In "Iteration #3" another PEG pair has been merged to form a four-PE PEG.

In some embodiments, the CPU considers the PE types when grouping PEs in PEGs. The CPU attempts to group PEs of the same type (i.e., PEs that perform the same functionality, although on different data) in the same PEG. Grouping PEs of the same type means that threads carrying out the same code are likely to run in parallel (or efficient) SIMT mode. In this case, the multi-processor scheduling does not need to handle code divergence or serialization, since the threads follow the same dynamic code trace. This sort of grouping improves the scheduling performance and the level of parallelization in the multi-processor.

In some embodiments, the CPU further subdivides each PEG into Read-Only (RO) region groups. A given RO region group comprises a set of PEs whose outputs are used as input to the same PEG. It is beneficial to have the PEs in a given RO region group store their outputs in successive addresses in device memory 56, because the PEG that uses these outputs as input can read the data using a single read command from memory 56. This sort of subdivision can be carried out iteratively, possibly in parallel with the PEG grouping process. An example of such a process is shown in section 6.5.9.3 of U.S. Provisional Patent Application 61/039,817, cited above.

In some cases, the simulated design is clocked by only a single clock signal. In these cases, the CPU may operate on the dependency graph itself (see FIGS. 3 and 4) and avoid the step of generating sub-graphs. Instead, the CPU may use a dual buffer mechanism. This feature is described in detail in section 6.6.1 of U.S. Provisional Patent Application 61/039, 817, cited above. For "edge" events, such as rising-clock events, when the GPU executes the PE dependency graph, PEs whose inputs originate from clocked PEs typically need to accept the values that the clocked PEs produced right before the rising edge of the clock. If the dependency graph were to update the clocked PEs' outputs, some clocked PEs would be updated before their driven PEs are executed, which may generate an incorrect output. One possible approach for resolving this issue is referred to as "even-and-odd buffers," and is generally more suitable for the single-clock scenario. In this approach, the simulation state comprises two separate buffers for the clocked PEs. One buffer holds the clocked PE outputs for even clock cycles, and the other buffer holds the outputs for odd clock cycles. In even clock cycles, the driven PEs receive their clocked-PE-inputs from the buffer of the odd clock cycles, and vice versa. Using this technique, the values of clocked PEs are separated between consecutive cycles. This feature is described in detail in section 6.6.1 of U.S. Provisional Patent Application 61/039,817, cited above. A second possible approach, which uses separate CLOCK and CLOCK UPDATE sub-graphs as shown in FIG. 4 above, is often more robust in the sense that it performs regardless of the number of clocks in the simulated design. In this approach, the dependency graph is divided into several sub-graphs. Separate CLOCK and CLOCK UPDATE sub-graphs are produced for each clock signal. The CLOCK sub-graph calculates the non-clocked PEs until reaching the inputs of clocked PEs, but does not update the output of the clocked PEs. The CLOCK UPDATE sub-graph, which is typically run after the CLOCK sub-graph, calculates the outputs of the clocked PEs (typically copies the input of the clocked PE to its output). This method also protects the PEs from receiving future values of clocked PEs.

In some embodiments, system 20 stores the simulation state for each clock cycle, such that the operator can access any of the simulation results, as desired. In alternative embodiments, however, the simulation may run in a "snapshot" mode, in which only selected snapshots of the simulation state are stored. The operator may request the simulation to start running from any desired snapshot, on an on-demand basis. Switching between continuous storage and snapshot storage can be performed in response to user request or upon the occurrence of a certain predefined event. This feature is described in detail in sections 6.2.4 and 6.3.3 of U.S. Provisional Patent Application 61/039,817, cited above.

Although the embodiments described herein refer mainly to GPUs, the disclosed methods and systems can be used with various other types of multi-processor devices having multiple processors that operate in parallel, such as Digital Signal Processors (DSPs) and multi-core Central Processing Units (CPUs). Although the embodiments described herein mainly address design simulation using parallel processors, the methods and systems described herein are not limited to design simulation and can also be used in various other applications having data-flow dependencies and potential parallelism, such as, for example, car-crash simulations, aircraft scheduling, signal processing problems, meteorology simulations, physical simulations and many others.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for design simulation, comprising:
   partitioning a logical verification task of a design into a first plurality of atomic Processing Elements (PEs);
   determining execution dependencies between the PEs, each execution dependency specifying that a respective first PE is to be executed before a respective second PE;
   providing a multiprocessor device, which comprises a second plurality of processors operating in parallel and schedules the PEs for execution by the processors according to a built-in scheduling policy of the microprocessor device;
   computing an order for executing the PEs on the multiprocessor device, the order formed of a sequence of slots to which the PEs are assigned, such that each second PE depending on a first PE is located in the order at least a predetermined number of slots after the respective first PE such that the order induces concurrent execution of the PEs by different ones of the processors without violating the execution dependencies irrespective of the scheduling policy of the multiprocessor device;
   providing the PEs and the computed order to the multiprocessor device for execution according to the scheduling policy, so as to produce a simulation result; and
   verifying a performance of the design responsively to the simulation result,
   wherein computing the order comprises preserving the execution dependencies by inserting dummy PEs into the order.

2. The method according to claim 1, wherein the multiprocessor device comprises a Graphics Processing Unit (GPU).

3. The method according to claim 1, wherein the multiprocessor device comprises at least one device type selected from a group of types consisting of a Digital Signal Processor and a multi-core Central Processing Unit (CPU).

4. The method according to claim 1, wherein the verification task comprises at least one element selected from a group of elements consisting of the design and a test environment for testing the design.

5. The method according to claim 1, wherein computing the order comprises dividing the PEs into a sequence of execution phases that are to be executed in succession so as to preserve the dependencies, and wherein executing the PEs comprises executing the PEs in a given execution phase only after the PEs in a preceding execution phases in the sequence are fully executed.

6. The method according to claim 5, wherein executing the PEs comprises invoking the multiprocessor device to execute the preceding execution phase, and invoking the multiprocessor device to execute the given execution phase after execution of the preceding execution phase is completed.

7. The method according to claim 1, wherein computing the order comprises ordering the PEs such that a time separation between the PEs specified in each execution dependency is not lower than a predefined minimum separation.

8. The method according to claim 7, wherein ordering the PEs comprises:
   giving priority in the order to the PEs, which are ready for execution and which provide input to a longest path of dependent PEs.

9. The method according to claim 7, wherein ordering the PEs comprises:
   identifying a first subset of the PEs, which depend on PEs whose execution has not yet started;
   identifying a second subset of the PEs, which depend on PEs whose execution has started but is not yet completed; and
   giving priority in the order to the PEs, which are ready for execution and whose execution would transition a highest number of the PEs from the first subset to the second subset.

10. The method according to claim 1, wherein partitioning the verification task comprises selecting each PE from a predefined set of PE types, and wherein executing the PEs comprises executing the same instruction by all the processors in the multiprocessor device, and indicating the PE types to the respective processors by providing data to the instruction.

11. The method according to claim 1, wherein the design comprises multiple electronic components that are interconnected according to a circuit topology, wherein the PEs simulate an operation of the electronic components, wherein computing the order comprises identifying a first subset of the PEs that respectively simulate a second subset of the electronic components that are not directly connected to one another in the circuit topology, and wherein executing the PEs comprises invoking at least some of the processors to execute the PEs in the first subset concurrently.

12. The method according to claim 11,
    wherein the atomic PEs each include a single atomic execution task belonging to one of the task types from the group including Look-Up Table lookups, Flip-Flop operations, buffering operations, memory access operations, multiplexing operations, arithmetic operations and logical operations.

13. The method according to claim 12, wherein the processors in the multiprocessor device are arranged in modules, such that the processors in each module access a device memory of the multiprocessor device jointly, wherein computing the order comprises grouping the PEs in PE Groups (PEGs), and wherein executing the PEs comprises executing each PEG by a respective module.

14. The method according to claim 13, wherein grouping the PEs comprises identifying PEs that use input produced by a common PE, and grouping the identified PEs in a given PEG.

15. The method according to claim 13, wherein grouping the PEs comprises attempting to group PEs of the same type in the same PEG.

16. The method according to claim 1, wherein execution of the PEs is performed responsively to receiving a command from a simulator.

17. The method according to claim 1, wherein the predetermined number of slots is at least equal to the number of PEs that the multiprocessor device can execute concurrently.

18. A method for design simulation, comprising:
partitioning a logical verification task of a design into a first plurality of atomic Processing Elements (PEs);
determining execution dependencies between the PEs, each execution dependency specifying that a respective first PE is to be executed before a respective second PE;
providing a multiprocessor device, which comprises a second plurality of processors operating in parallel and schedules the PEs for execution by the processors according to a built-in scheduling policy of the microprocessor device;
computing an order for executing the PEs on the multiprocessor device, the order formed of a sequence of slots to which the PEs are assigned, such that each second PE depending on a first PE is located in the order at least a predetermined number of slots after the respective first PE such that the order induces concurrent execution of the PEs by different ones of the processors without violating the execution dependencies irrespective of the scheduling policy of the multiprocessor device;
providing the PEs and the computed order to the multiprocessor device for execution according to the scheduling policy, so as to produce a simulation result; and
verifying a performance of the design responsively to the simulation result,
wherein partitioning the verification task comprises identifying multiple subsets of the PEs, such that each subset comprises the PEs that are affected by a respective external event applied to the design, and wherein computing the order comprises determining respective orders within each of the subsets.

19. The method according to claim 18, wherein computing the order comprises preserving the execution dependencies by inserting dummy PEs into the order.

20. The method according to claim 18, wherein the external event comprises an asynchronous signal.

21. The method according to claim 20, wherein the asynchronous signal comprises one of a clock signal and a reset signal.

22. A method for design simulation, comprising:
partitioning a logical verification task of a design into a first plurality of atomic Processing Elements (PEs);
determining execution dependencies between the PEs, each execution dependency specifying that a respective first PE is to be executed before a respective second PE;
providing a multiprocessor device, which comprises a second plurality of processors operating in parallel and schedules the PEs for execution by the processors according to a built-in scheduling policy of the microprocessor device;
computing an order for executing the PEs on the multiprocessor device, the order formed of a sequence of slots to which the PEs are assigned, such that each second PE depending on a first PE is located in the order at least a predetermined number of slots after the respective first PE such that the order induces concurrent execution of the PEs by different ones of the processors without violating the execution dependencies irrespective of the scheduling policy of the multiprocessor device;
providing the PEs and the computed order to the multiprocessor device for execution according to the scheduling policy, so as to produce a simulation result; and
verifying a performance of the design responsively to the simulation result,
wherein the processors in the multiprocessor device are arranged in modules, such that the processors in each module access a device memory of the multiprocessor device jointly, wherein computing the order comprises grouping the PEs in PE Groups (PEGs),
wherein grouping the PEs comprises maximizing respective sizes of the PEGs while minimizing respective numbers of outputs provided to the PEGs, and
wherein executing the PEs comprises executing each PEG by a respective module.

23. The method according to claim 22, wherein executing the PEs comprises synchronizing access to the device memory by the PEs within a given PEG.

24. The method according to claim 23, wherein synchronizing the access comprises communicating among the PEs in the given PEG via a shared memory of the module that executes the given PEG.

25. The method according to claim 23, wherein synchronizing the access comprises communicating among the PEs in the given PEG via a hardware synchronization mechanism provided by the module that executes the given PEG.

26. The method according to claim 23, wherein synchronizing the access comprises causing the PEs in the given PEG to access successive addresses in the device memory.

27. The method according to claim 22, wherein grouping the PEs comprises identifying PEs that use input produced by a common PE, and grouping the identified PEs in a given PEG.

28. The method according to claim 22, wherein grouping the PEs further comprises sub-dividing a given PEG into subsets of the PEs, each subset comprising the PEs that provide output to a common PEG.

29. A method for design simulation, comprising:
partitioning a logical verification task of a design into a first plurality of atomic Processing Elements (PEs);
determining execution dependencies between the PEs, each execution dependency specifying that a respective first PE is to be executed before a respective second PE;
providing a multiprocessor device, which comprises a second plurality of processors operating in parallel and schedules the PEs for execution by the processors according to a built-in scheduling policy of the microprocessor device;
computing an order for executing the PEs on the multiprocessor device, the order formed of a sequence of slots to which the PEs are assigned, such that each second PE depending on a first PE is located in the order at least a predetermined number of slots after the respective first PE such that the order induces concurrent execution of the PEs by different ones of the processors without violating the execution dependencies irrespective of the scheduling policy of the multiprocessor device;
providing the PEs and the computed order to the multiprocessor device for execution according to the scheduling policy, so as to produce a simulation result; and
verifying a performance of the design responsively to the simulation result,
wherein the processors in the multiprocessor device are arranged in modules, such that the processors in each module access a device memory of the multiprocessor device jointly, wherein computing the order comprises grouping the PEs in PE Groups (PEGs), and
wherein grouping the PEs comprises maximizing respective sizes of the PEGs while minimizing respective numbers of inputs provided to the PEGs.

30. The method according to claim 29, wherein grouping the PEs comprises iteratively merging pairs of the PEGs so as to maximize the sizes while minimizing the numbers of the inputs and a number of memory access operations performed by each of the PEGs.

31. A method for design simulation, comprising:
partitioning a logical verification task of a design into a first plurality of atomic Processing Elements (PEs);
determining execution dependencies between the PEs, each execution dependency specifying that a respective first PE is to be executed before a respective second PE;
providing a multiprocessor device which comprises a second plurality of processors operating in parallel and schedules the PEs for execution by the processors according to a built-in scheduling policy of the microprocessor device;
computing an order for executing the PEs on the multiprocessor device, the order formed of a sequence of slots to which the PEs are assigned, such that each second PE depending on a first PE is located in the order at least a predetermined number of slots after the respective first PE such that the order induces concurrent execution of the PEs by different ones of the processors without violating the execution dependencies irrespective of the scheduling policy of the multiprocessor device;
providing the PEs and the computed order to the multiprocessor device for execution according to the scheduling policy, so as to produce a simulation result; and
verifying a performance of the design responsively to the simulation result,
wherein executing the PEs comprises evaluating simulation state values at respective time intervals, and storing the simulation state values in at least one operational mode selected from a group of modes consisting of a continuous mode in which the simulation state values are stored continuously, and a snapshot mode in which only selected snapshots of the simulation state values are stored.

32. A computing method, comprising:
representing a computing task by a first plurality of atomic Processing Elements (PEs) having execution dependencies, each execution dependency specifying that a respective first PE is to be executed before a respective second PE;
computing an order for executing the PEs on a multiprocessor device, which comprises a second plurality of processors operating in parallel and schedules the PEs for execution by the processors according to a built-in scheduling policy of the multiprocessor device, such that each second PE depending on a first PE is located in the order at least a predetermined number of slots after the respective first PE so that the order induces concurrent execution of the PEs by different ones of the processors without violating the execution dependencies irrespective of the scheduling policy of the multiprocessor device; and
executing the PEs on the processors in accordance with the computed order and the scheduling policy, to produce a result of the computing task,
wherein computing the order comprises preserving the execution dependencies by inserting dummy PEs into the order.

33. Apparatus for design simulation, comprising:
an interface, which is coupled to accept a definition of a verification task of a design to be simulated; and
a Central Processing Unit (CPU), which is arranged to partition the definition into a first plurality of atomic Processing Elements (PEs) having execution dependencies, each execution dependency specifying that a respective first PE is to be executed before a respective second PE, to compute an order for executing the PEs on a multiprocessor device, which comprises a second plurality of processors operating in parallel and schedules the PEs for execution by the processors according to a built-in scheduling policy of the microprocessor device, such that each second PE depending on a first PE is located in the order at least a predetermined number of slots after the respective first PE so that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to simulate the design,
wherein the CPU is arranged to identify multiple subsets of the PEs, such that each subset comprises the PEs that are affected by a respective external event applied to the design, and to compute respective orders for executing the PEs within each of the subsets.

34. The apparatus according to claim 33, wherein the multiprocessor device comprises a Graphics Processing Unit (GPU).

35. The apparatus according to claim 33, wherein the multiprocessor device comprises at least one device type selected from a group of types consisting of a Digital Signal Processor and a multi-core Central Processing Unit (CPU).

36. The apparatus according to claim 33, wherein the verification task comprises at least one element selected from a group of elements consisting of the design and a test environment for testing the design.

37. The apparatus according to claim 33, wherein the CPU is arranged to compute the order by dividing the PEs into a sequence of execution phases that are to be executed in succession so as to preserve the dependencies, and to cause the processors to execute the PEs in a given execution phase only after the PEs in a preceding execution phase in the sequence are fully executed.

38. The apparatus according to claim 37, wherein the CPU is arranged to invoke the multiprocessor device to execute the preceding execution phase, and to invoke the multiprocessor device to execute the given execution phase after execution of the preceding execution phase is completed.

39. The apparatus according to claim 33, wherein the CPU is arranged to order the PEs such that a time separation between the PEs specified in each execution dependency is not lower than a predefined minimum separation.

40. The apparatus according to claim 39, wherein the CPU is arranged to identify a first subset of the PEs, which depend on PEs whose execution has not yet started, to identify a second subset of the PEs, which depend on PEs whose execution has started but is not yet completed, and to give priority in the order to the PEs, which are ready for execution and which provide input to a longest path of dependent PEs.

41. The apparatus according to claim 39, wherein the CPU is arranged to identify a first subset of the PEs, which depend on PEs whose execution has not yet started, to identify a second subset of the PEs, which depend on PEs whose execution has started but is not yet completed, and to give priority in the order to the PEs that are ready for execution and whose execution would transition a highest number of the PEs from the first subset to the second subset.

42. The apparatus according to claim 33, wherein the processors in the multiprocessor device are arranged in modules, such that the processors in each module access a device memory of the multiprocessor device jointly, and wherein the CPU is arranged to group the PEs in PE Groups (PEGs) and to cause the multiprocessor device to execute each PEG by a respective module.

43. The apparatus according to claim 42, wherein the CPU is arranged to cause the processors to synchronize access to the device memory by the PEs within a given PEG.

44. The apparatus according to claim 43, wherein the CPU is arranged to cause the processors to communicate among the PEs in the given PEG via a shared memory of the module that executes the given PEG, so as to synchronize the access to the device memory.

45. The apparatus according to claim 44, wherein the CPU is arranged to cause the processors to communicate among the PEs in the given PEG via a hardware synchronization mechanism provided by the module that executes the given PEG, so as to synchronize the access to the device memory.

46. The apparatus according to claim 44, wherein the CPU is arranged to cause the processors to cause the PEs in the given PEG to access successive addresses in the device memory.

47. The apparatus according to claim 42, wherein the CPU is arranged to identify PEs that use input produced by a common PE, and to group the identified PEs in a given PEG.

48. The apparatus according to claim 42, wherein the CPU is arranged to sub-divide a given PEG into subsets of the PEs, each subset comprising the PEs that provide output to a common PEG.

49. The apparatus according to claim 33, wherein all the processors in the multiprocessor device execute the same instruction, and wherein the CPU is arranged to select each PE from a predefined set of PE types, and to indicate the PE types to the respective processors by providing data to the instruction.

50. The apparatus according to claim 33, wherein the design comprises multiple electronic components that are interconnected according to a circuit topology, wherein the PEs simulate an operation of the electronic components, and wherein the CPU is arranged to identify a first subset of the PEs that respectively simulate a second subset of the electronic components that are not directly connected to one another in the circuit topology, and to cause at least some of the processors to execute the PEs in the first subset concurrently.

51. Apparatus according to claim 50,
wherein the atomic software PEs each include a single atomic execution task belonging to one of the task types from the group including Look-Up Table lookups, Flip-Flop operations, buffering operations, memory access operations, multiplexing operations, arithmetic operations and logical operations.

52. The apparatus according to claim 33, wherein the CPU is arranged to execute the PEs responsively to receiving an external event.

53. Apparatus for design simulation, comprising:
an interface, which is coupled to accept a definition of a verification task of a design to be simulated; and
a Central Processing Unit (CPU), which is arranged to partition the definition into a first plurality of atomic Processing Elements (PEs) having execution dependencies, each execution dependency specifying that a respective first PE is to be executed before a respective second PE, to compute an order for executing the PEs on a multiprocessor device, which comprises a second plurality of processors operating in parallel and schedules the PEs for execution by the processors according to a built-in scheduling policy of the microprocessor device, such that each second PE depending on a first PE is located in the order at least a predetermined number of slots after the respective first PE so that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to simulate the design,
wherein the CPU is arranged to preserve the execution dependencies by inserting dummy PEs into the order.

54. The apparatus according to claim 53, wherein the CPU is arranged to identify multiple subsets of the PEs, such that each subset comprises the PEs that are affected by a respective external event applied to the design, and to compute respective orders for executing the PEs within each of the subsets.

55. The apparatus according to claim 54, wherein the external event comprises an asynchronous signal.

56. The apparatus according to claim 55, wherein the asynchronous signal comprises one of a clock signal and a reset signal.

57. Apparatus for design simulation, comprising:
an interface, which is coupled to accept a definition of a verification task of a design to be simulated; and
a Central Processing Unit (CPU), which is arranged to partition the definition into a first plurality of atomic Processing Elements (PEs) having execution dependencies, each execution dependency specifying that a respective first PE is to be executed before a respective second PE, to compute an order for executing the PEs on a multiprocessor device, which comprises a second plurality of processors operating in parallel and schedules the PEs for execution by the processors according to a built-in scheduling policy of the microprocessor device, such that each second PE depending on a first PE is located in the order at least a predetermined number of slots after the respective first PE so that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to simulate the design,
wherein the processors in the multiprocessor device are arranged in modules, such that the processors in each module access a device memory of the multiprocessor device jointly, and wherein the CPU is arranged to group the PEs in PE Groups (PEGs) and to cause the multiprocessor device to execute each PEG by a respective module,
wherein the CPU is arranged to group the PEs by maximizing respective sizes of the PEGs while minimizing respective numbers of inputs provided to the PEGs.

58. The apparatus according to claim 57, wherein the CPU is arranged to iteratively merge pairs of the PEGs so as to maximize the sizes while minimizing the numbers of the inputs and a number of memory access operations performed by each of the PEGs.

59. The apparatus according to claim 57, wherein the CPU is arranged to group the PEs by maximizing respective sizes of the PEGs while minimizing respective numbers of outputs provided to the PEGs.

60. Apparatus for design simulation, comprising:
an interface, which is coupled to accept a definition of a verification task of a design to be simulated; and
a Central Processing Unit (CPU), which is arranged to partition the definition into a first plurality of atomic Processing Elements (PEs) having execution dependencies, each execution dependency specifying that a respective first PE is to be executed before a respective second PE, to compute an order for executing the PEs on a multiprocessor device, which comprises a second plurality of processors operating in parallel and schedules the PEs for execution by the processors according to a built-in scheduling policy of the microprocessor device, such that each second PE depending on a first PE is located in the order at least a predetermined number of slots after the respective first PE so that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to simulate the design, wherein the CPU is arranged to evaluate simulation state values at respective time intervals, and to store the simulation state values in at least one operational mode selected from a group of modes consisting of a continuous mode in which the simulation state values are stored continuously, and a snapshot mode in which only selected snapshots of the simulation state values are stored.

61. Apparatus for design simulation, comprising:

a multiprocessor device, which comprises multiple processors configured to operate in parallel and schedules execution by the processors according to a built-in scheduling policy; and a Central Processing Unit (CPU), which is arranged to partition the definition of a verification task of a design into a plurality of atomic Processing Elements (PEs) having execution dependencies, each execution dependency specifying that a first respective PE is to be executed before a second respective PE, to compute an order for executing the PEs on the multiple processors of the multiprocessor device, such that each second PE depending on a first PE is located in the order at least a predetermined number of slots after the respective first PE so that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to simulate the design, wherein the CPU is arranged to preserve the execution dependencies by inserting dummy PEs into the order.

62. A computing apparatus, comprising:

an interface, which is coupled to accept a definition of computing task; and a Central Processing Unit (CPU), which is arranged to partition the definition into a first plurality of atomic Processing Elements (PEs) having execution dependencies, each execution dependency specifying that a respective first PE is to be executed before a respective second PE, to compute an order for executing the PEs on a multiprocessor device, which comprises a second plurality of processors operating in parallel and schedules the PEs for execution by the processors according to a built-in scheduling policy of the microprocessor device, such that each second PE depending on a first PE is located in the order at least a predetermined number of slots after the respective first PE so that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to produce a result of the computing task, wherein the CPU is arranged to preserve the execution dependencies by inserting dummy PEs into the order.

63. A computer software product for design simulation, the product comprising a non-transitory computer-readable medium, in which program instructions are stored, which instructions, when read by a computer, cause the computer to partition a definition of a verification task of a design into a first plurality of atomic Processing Elements (PEs) having execution dependencies, each execution dependency specifying that a first respective PE is to be executed before a second respective PE, to compute an order for executing the PEs on a multiprocessor device, which comprises a second plurality of processors operating in parallel and schedules the PEs for execution by the processors according to a built-in scheduling policy of the microprocessor device, such that each second PE depending on a first PE is located in the order at least a predetermined number of slots after the respective first PE so that the order induces concurrent execution of the PEs by different ones of the processors without violating the execution dependencies irrespective of the scheduling policy of the multiprocessor device, and to cause the processors to execute the PEs in accordance with the computed order and the scheduling policy so as to simulate the design, wherein the program instructions are arranged to preserve the execution dependencies by inserting dummy PEs into the order.

* * * * *